(12) United States Patent
Oh et al.

(10) Patent No.: US 7,962,876 B2
(45) Date of Patent: *Jun. 14, 2011

(54) GENERATION OF ENGINEERING CHANGE ORDER (ECO) CONSTRAINTS FOR USE IN SELECTING ECO REPAIR TECHNIQUES

(75) Inventors: Nahmsuk Oh, Goleta, CA (US); Peivand Fallah-Tehrani, Camarillo, CA (US); Alireza Kasnavi, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 229 days.

This patent is subject to a terminal disclaimer.

(21) Appl. No.: 12/263,447

(22) Filed: Oct. 31, 2008

(65) Prior Publication Data
US 2009/0055787 A1    Feb. 26, 2009

Related U.S. Application Data

(63) Continuation of application No. 11/525,578, filed on Sep. 22, 2006, now Pat. No. 7,454,731.

(51) Int. Cl.
G06F 17/50    (2006.01)
(52) U.S. Cl. .......................... 716/113; 716/115
(58) Field of Classification Search .................. 716/4–6, 716/110–114
See application file for complete search history.

(56) References Cited

U.S. PATENT DOCUMENTS

| | | | |
|---|---|---|---|
| 7,069,528 B2 | 6/2006 | Kovacs et al. | |
| 7,363,605 B1 | 4/2008 | Kondratyev et al. | |
| 7,363,607 B2 | 4/2008 | Birch et al. | |
| 7,383,522 B2 | 6/2008 | Murgai et al. | |
| 7,454,731 B2 * | 11/2008 | Oh et al. | 716/6 |

OTHER PUBLICATIONS

Entire Prosecution History of U.S. Appl. 11/525,578, filed Sep. 22, 2006 by Nahmsuk Oh et al. issued as US Patent 7,454,731.

Hanchate, N. et al., "A Linear Time Algorithm for Wire Sizing with Simultaneous Optimization of Interconnect Delay and Crosstalk Noise", Proceedings of the 19th International Conference on VLSI Design, (VLSID'06), 2006, 283-290.

Alpert, C. J. et al., "Buffer Insertion for Noise and Delay Optimization", IEEE Transactions on computer-aided design of integrated circuits and systems, Nov. 1999, vol. 18, No. 11, pp. 1633-1645.

(Continued)

*Primary Examiner* — Jack Chiang
*Assistant Examiner* — Binh C Tat
(74) *Attorney, Agent, or Firm* — Silicon Valley Patent Group LLP; Omkar Suryadevara

(57) ABSTRACT

Static timing and/or noise analysis are performed on a netlist of an integrated circuit, to estimate behavior of the netlist and to identify at least one violation by said behavior of a corresponding requirement thereon, such as setup time, hold time or bump height in a quiescent net. Thereafter, effect of engineering change order (ECO) to correct the violation are automatically analyzed, based on the layout, the parasitics, the timing and/or noise behavior, and the violation, followed by generation of a constraint on the behavior (called "ECO" constraint), such as a timing constraint and/or a noise constraint. Next, the ECO constraint is automatically used, e.g. in a place and route tool, to select an ECO repair technique, from several ECO repair techniques that can overcome the violation. The selected ECO repair technique is automatically applied to the layout, to generate a modified layout which does not have the violation.

34 Claims, 14 Drawing Sheets

OTHER PUBLICATIONS

Jiang, Iris Hui-Ru et al., "Crosstalk-Driven Interconnect Optimization by Simultaneous Gate and Wire Sizing", IEEE Transactions on computer-aided design of integrated circuits and systems, Sep. 2000, vol. 19, No. 9, pp. 999-1010.

Vittal, A. et al., "Crosstalk Reduction for VLSI", IEEE Transactions on computer-aided design of integrated circuits and systems, Mar. 1997, vol. 16, No. 3, pp. 290-298.

Saxena, P. et al., "A Postprocessing Algorithm for Crosstalk-Driven Wire Perturbation", IEEE Transactions on computer-aided design of integrated circuits and systems, Jun. 2000, vol. 19, No. 6, pp. 691-702.

Becer, M. R. et al., "Postroute Gate Sizing for Crosstalk Noise Reduction", IEEE Transactions on computer-aided design of integrated circuits and systems, Dec. 2004, vol. 23, No. 12, pp. 1670-1677.

Odabasioglu, A. et al., "PRIMA: Passive Reduced-Order Interconnect Macromodeling Algorithm", IEEE Transactions on computer-aided design of integrated circuits and systems, Aug. 1998, vol. 17, No. 8, pp. 645-654.

Zhou, H. et al., "Global Routing with Crosstalk Constrains", IEEE Transactions on computer-aided design of integrated circuits and systems, Nov. 1999, vol. 18, No. 11, pp. 1683-1688.

Xiao, T. et al., "Gate Sizing to Eliminate Crosstalk Induced Timing Violation", Proceedings of the International Conference on Computer Design: VLSI in Computers and Processors (ICCD'01), 2001, pp. 186-191.

Chen, Chung-Ping et al., "Noise-aware Repeater Insertion and Wire Sizing for On-chip Interconnect Using Hierarchical Moment-Matching", 36$^{th}$ Annual Conference on Design Automation (DAC'99), 1999, pp. 502-506.

Bai, X. et al., "Noise-Aware Driver Modeling for Nanometer Technology", Fourth International Symposium on Quality Electronic Design, 2003, 6 pgs.

Shepard, K. L., "Design Methodologies for Noise in Digital Integrated Circuits", 35$^{th}$ Design Automation Conference, 1998, 6 pgs.

Shepard, K. L. et al., "Harmony: Static Noise Analysis of Deep Submicron Digital Integrated Circuits", IEEE Transactions on computer-aided design of integrated circuits and systems, Aug. 1999, vol. 18, No. 8, pp. 1132-1150.

Guardiani, C. et al., "Modeling the Effect of Wire Resistance in Deep Submicron Coupled Interconnects for Accurate Crosstalk Based Net Sorting", Proc. of PATMOS, Oct. 1998, (Advanced Research, Central R&D, DAIS, STMicroelectronics, via C. Olivetti, 2, I-20041 Agrate B., (MI), Italy), pp. 287-296.

Pandini, D. et al., "Network Reduction for Crosstalk Analysis in Deep Submicron Technologies", International Workshop on Timing Issues, 1997, (Advanced Research, SGS-Thomson Microelectronics, via C. Olivetti 2, 20041 Agrate Brianza, Italy), 10 pgs.

Elmore, W.C. "The Transient Response of Damped Linear Networks with Particular Regard to Wideband Amplifiers", Journal of Applied Physics, vol. 19, Jan. 1948, pp. 55-63.

* cited by examiner

GENERATION OF ENGINEERING CHANGE ORDER (ECO) CONSTRAINTS FOR USE IN SELECTING ECO REPAIR TECHNIQUES

CROSS-REFERENCE TO PARENT APPLICATION

This application is a continuation application of U.S. application Ser. No. 11/525,578 filed on Sep. 22, 2006 now U.S. Pat. No. 7,454,731, by Nahmsuk Oh et al. U.S. application Ser. No. 11/525,578 is incorporated by reference herein in its entirety.

BACKGROUND

1. Field of the Invention

The invention relates to verification of a design of an integrated circuit (IC). More specifically, the invention relates to a method and an apparatus to overcome undesirable electrical interaction (called "capacitive crosstalk") which may arise between wires and/or devices that are physically placed and/or routed adjacent to one another in an IC design.

2. Related Art

Crosstalk is an undesirable electrical interaction between two or more physically adjacent nets due to capacitive cross-coupling. As integrated circuit technologies advance toward smaller geometries, crosstalk effects become increasingly important. The reasons for crosstalk are apparent from reviewing FIGS. 1A and 1B. As circuit geometries become smaller, wire interconnections become closer together and taller, thus increasing the cross-coupling capacitance between nets. At the same time, parasitic capacitance to the substrate (see FIGS. 1A and 1B) becomes less as interconnections become narrower, and cell delays are reduced as transistors become smaller. With circuit geometries at 0.25 micron and above, substrate capacitance is usually the dominant effect. However, with geometries at 0.18 micron and below, the coupling capacitance between nets becomes significant, making crosstalk analysis increasingly important for accurate timing analysis.

For example, consider the signal waveforms on a pair of nets A and B in FIG. 1C that are cross-coupled due to being placed adjacent to one another. Net B (also called "victim" net) should be constant, but the rising edge on net A (also called "aggressor" net) causes a noise bump or glitch 101 on net B. If the bump is sufficiently large and wide, it can cause an incorrect logic value to be propagated to the next gate in the path containing net B. As another example, consider the signal waveforms in FIG. 1D. Due to capacitive cross-coupling, the transitions on aggressor nets A and C can affect the time at which the transition occurs on victim net B. A rising-edge transition on net A at the time T2 shown in FIG. 1D can cause transition 102 which occurs later on net B, possibly contributing to a setup violation for a path containing B. Similarly, a falling-edge transition on net C at time T1 can cause transition 103 which occurs earlier on net B, possibly contributing to a hold violation for a path downstream that receives the signal from net B.

Prior art software tools are available to analyze (when the software is loaded into a computer and executed therein) and report on signal delays due to crosstalk of the type shown in FIGS. 1C and 1D. For example, a tool called "PrimeTime®SI" available from Synopsys, Inc. of Mountain View Calif. can be used to report on delay changes and static noise. Note that "PrimeTime®SI" is an enhancement to a static timing analysis tool called PrimeTime® also available from Synopsys, Inc. A timing report which is generated by crosstalk analysis typically identifies violations in setup time, hold time and/or signal arrival used to generate an Engineering Change Order (ECO). The ECO is typically used by a human (as per act 114 in FIG. 1E) who operates another prior art software tool that performs placement and routing, and an example the tool is called Astro™ also available from Synopsys, Inc.

As noted above, an aggressor net (at top of FIG. 1F) injects a crosstalk glitch onto a victim net through one or more coupling capacitors. The crosstalk glitch impacts the delay of victim net by increasing or decreasing it. The amount of this increase or decrease is called "crosstalk delay". Such a victim net is typically present in a path (called "critical path") consisting of timing nodes which represent pins on the path. A timing requirement on such a path may be expressed as the latest (or the earliest) time at which a signal can arrive without making the clock cycle longer (or shorter) than desired. Specifically, the arrival time is signal propagation time from a given starting point. Another timing requirement may be expressed in the form of slack which is the difference between the required time and the arrival time. When the slack of a path is negative, the path has a timing violation.

Correction of crosstalk induced violations using prior art methods known to inventors is difficult and often requires significant manual intervention across several iterations between the crosstalk analysis tool and the place and route tool. For example, the human can make some layout changes in a place and route tool to correct the crosstalk violations, and then send the updated parasitic data (e.g. in Standard Parasitic Exchange Format, abbreviated as SPEF) and IC design data (e.g. in Verilog) to the static timing and noise analysis tool to verify that the problems are corrected, and that there are no new problems. If the static timing and noise analysis tool finds any violations in the modified design then the process is repeated, requiring significant human effort.

For faster repair of crosstalk induced violations, a human can directly perform a "what-if" analysis on certain design changes entirely within a static timing analysis tool. For analyzing these changes, the static timing and noise analysis tool uses a fast "incremental" analysis, taking just a fraction of the time needed for a full analysis, because it updates only a portion of the design which is affected by the changes proposed by the human to correct the crosstalk induced violations. Examples of manually driven changes include increasing the drive strength of victim nets by increasing the sizes of the driving cells using a command "size_cell" or by inserting buffers using another command "insert_buffer." Another technique is to move apart adjacent victim/aggressor nets with the command "set_coupling_separation."

However, even with "what-if" analysis, manual work is required, e.g. to come up with the what-if scenarios, to type the just-described commands, and to evaluate results of what-if analysis which are reported by the static timing analysis tool. Sometimes fixing a problem does not solve it, because the problem simply moves to another location, an example of which is illustrated in FIGS. 1F and 1G. Specifically, sizing up a victim driver cell (see bottom net in FIG. 1F) reduces its drive/holding resistance resulting in smaller crosstalk delay. However, the sized up victim driver cell (see FIG. 1G) now behaves as a strong aggressor for a receiver cell in the original aggressor net (the top net in FIG. 1G). This causes a large crosstalk delay for the aggressor net which in turn may create a new timing violation.

Moreover, even if it appears during crosstalk analysis, that sizing up a cell is feasible, it is possible that the place and route tool is unable to size up the same cell, e.g. if there is no physical space available for upsizing in its neighborhood.

Also, in certain situations, each of several parallel paths n1-n3 (FIG. 1H) in a tree may have a negative slack. One repair technique is to repair all nets n1-n3. Another alternative technique is to only repair net n0. Both techniques remedy the timing violation and they may both appear equally good at the crosstalk analysis stage, but which one of these two techniques can be used without requiring further iteration is unknown until after invoking the place and route tool with appropriate ECO(s). Hence, these types of problems cause multiple iterations of ECO based on human input and/or trial-and-error which may not necessarily converge, especially in case of large IC designs.

SUMMARY

A computer is programmed in accordance with the invention to automatically perform static timing and/or noise analysis on a netlist of an integrated circuit, to estimate behavior of the netlist and to identify at least one violation by said behavior of a corresponding requirement thereon, such as setup time, hold time or bump height in a quiescent net. Thereafter, changes in behavior of the layout in response to an engineering change order (ECO) to address the violation are automatically analyzed by the computer, based on the layout, the parasitics, the behavior, and the violation. Based on the behavior changes, the computer automatically generates one or more constraints on the behavior (called "ECO" constraint), such as a timing constraint and/or a noise constraint. The ECO constraint(s) are eventually used to automatically select an ECO repair technique, from among known ECO repair techniques that can overcome the violation. The selected ECO repair technique is applied to the layout, to generate a modified layout which does not have the violation. The computer may repeat the just-described acts on the modified layout, to check if new violations have arisen and if so the new violations are also corrected as just described.

DETAILED DESCRIPTION

Figure 9A:
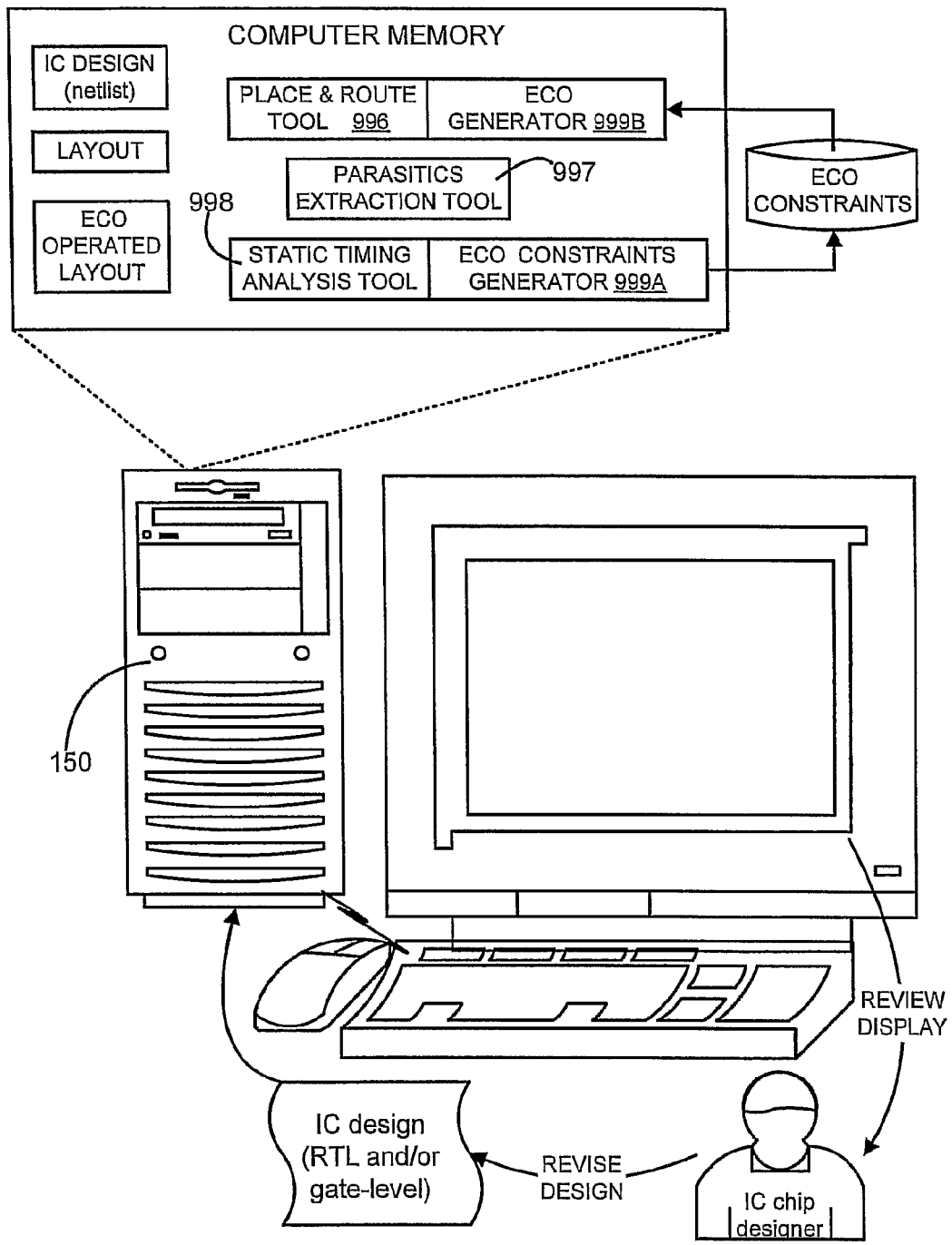
FIG. 9A illustrates, in a block diagram, a computer that is programmed in accordance with the invention.

A computer 150 (FIG. 9A) is programmed in several illustrative embodiments of the invention to automatically perform static timing and/or noise analysis on an IC design in the form of a netlist, to estimate timing and/or noise behavior of a layout for the netlist obtained from a place and route operation (which places blocks of circuitry and routes wires therebetween), and to identify at least one violation by the behavior of a corresponding requirement thereon, such as setup time, hold time or bump height in a quiescent net.

Timing violations are typically identified (at the end of static timing analysis) as a list of endpoints of corresponding paths in the netlist. The computer 150 then identifies one or more victim nets that are located in a fanin cone of each endpoint in the list of timing violations, and also identifies a group of aggressor nets, wherein each aggressor net is capacitively coupled to one of the victim nets. Noise violations are typically identified (at the end of static noise analysis) as a list of victim nets in the netlist. The computer 150 then identifies a group of aggressor nets, wherein each aggressor net is capacitively coupled to one of the victim nets.

Thereafter, changes in behavior of the layout that would arise on performance of an engineering change order (ECO) to address the violation(s) are automatically estimated by software (called "ECO constraints generator 999A) in the computer (as per act 216 in FIG. 2A), based on the layout, the parasitics, the behavior, and the violation(s). Based on the behavior changes, the computer when programmed with the ECO constraints generator 999A, automatically identifies a subset of nets that are to be repaired (as per act 217 in FIG. 2A), followed by generation (as per act 218) of one or more constraints on ECO repair techniques that can be used (called "ECO" constraint), such as a timing constraint and/or a noise constraint. ECO constraints generator 999A of these embodiments is tightly coupled to a static timing (and noise) analysis tool 998 (see FIG. 9A).

When preparing ECO constraints as per acts 216-218 (FIG. 2A), generator 999A of some embodiments does not require accurate physical information, which is normally needed to decide which ECO repair technique is best for a given location in the layout. Instead, generator 999A of these embodiments simply identifies (in act 218) a precise constraint on any behavioral change that can arise from ECO repair, by location and amount. An example of an ECO constraint output by generator 999A is "10% delay reduction on pin A". Note that the ECO constraint of this example identifies a specific location (e.g. pin A) as well as a specific amount of change (e.g. 10%) that must be accomplished in order to overcome the violation. To generate ECO constraints, generator 999A of some embodiments quickly estimates new timing information before repair (in act 216), and minimizes the number of repairs needed for the layout when possible (in act 217).

Depending on the embodiment, ECO constraints can be stored in non-volatile memory, e.g. in a file on disk (see FIG. 9B) which is useful for transfer to another computer. Alternatively the ECO constraints can be retained in main memory of the computer. The ECO constraint(s) are eventually received in a computer (which may or may not be the same computer that generated the ECO constraints) that is programmed with certain software (called ECO generator 999B) to receive and use the ECO constraints (as shown by branch 220 in FIG. 2A). In some embodiments, ECO constraints are encrypted for transfer from ECO constraints generator 999A to ECO generator 999B, although encryption is not used in certain other embodiments of the invention. Note that encryption is not a critical aspect of the invention, and any encryption method and/or keys may be used or not used, depending on the embodiment.

Based on each ECO constraint, the ECO generator 999B automatically selects a specific ECO repair technique, from among several ECO repair techniques that are known to overcome capacitive coupling, and thus reduce or eliminate the violation from which the ECO constraint was generated. For example, ECO generator 999B checks if an ECO repair technique (as per act 253 in FIG. 2B) satisfies an ECO constraint, and if so that ECO repair technique is marked as being selected for use in repair (as per act 255) and if not then another ECO repair technique is checked (as per branch 253A). Some embodiments of the invention select one of the following three ECO repair techniques to fix the just-described violation: (a) upsizing (also called "enlarging") a cell in a victim net, (b) adding a buffer in the victim net and (c) increasing spacing between the victim net and its aggressor net(s). Hence, in act 253, software 999B automatically selects whichever one of these three techniques (a)-(c) is found to satisfy the ECO constraint generated by software 999A. ECO generator 999B repeats the just described act 253, for all ECO constraints (as per act 257). The selected ECO repair techniques are thereafter used to automatically correct one or more violations that were identified in act 114. Hence, a computer 150 when programmed with softwares 999A and 999B eliminates the prior art method of manual fixing by trial and error.

ECO generator 999B of some embodiments is tightly coupled to a place & route tool 996 with access to a layout used to identify the violations. Via the ECO constraints, ECO generator 999B receives accurate timing and noise information about each location in the layout, and evaluates one or more ECO techniques (such as sizing a cell, inserting a buffer, or rerouting wires) based on the physical limitations inherent in the layout, and picks an ECO technique which satisfies the specified ECO constraints. Thereafter, the selected ECO repair techniques are applied by the place and route tool 996 to the layout, to generate a modified layout which does not have the violation.

Note that ECO constraints generator 999A of several embodiments estimates in act 216, a number of timing delay and bump height changes that arise from repair. Some embodiments compute stage delay (see 315 in FIG. 3B) as the summation of cell delay (see 311 in FIG. 3B), net delay (also called "wire delay"), and crosstalk delay, and a change in each of these delays is individually estimated. Note that net delay and crosstalk delay are shown together as 312 in FIG. 3B. The computation of these behavioral changes that will arise from ECO repair is done (in act 216 of FIG. 2A) by software 999A even before any actual ECO repair is done by software 999B (in act 259 of FIG. 2B). Hence, iteration between softwares 999A and 999B converges quickly in most IC designs that are close to timing signoff. Moreover, in some embodiments this iteration process is fully automated, and does not require any manual intervention.

Note that in some embodiments of the invention, a computer is not programmed with five separate softwares 996, 997, 998, 999A and 999B, and instead all of them are merged into a single tool that performs a place and route operation, a parasitic extraction operation, a static timing & noise analysis operation as well as ECO constraint generation and ECO generation automatically, all within the same tool in the same computer. Numerous embodiments will be apparent to the skilled artisan in view of this disclosure.

For example, in some other embodiments, the software 996 and 999B are merged into a single tool, which forms an enhanced place and route tool (such as Astro™ available from Synopsys, Inc) while the software 998 and 999A are merged into another tool which forms an enhanced static analysis tool (such as PrimeTime®SI also available from Synopsys, Inc). Hence, an enhanced timing & noise analysis tool in accordance with the invention automatically generates ECO constraints while an enhanced place & route tool in accordance with the invention automatically uses the ECO constraints.

In certain alternative embodiments, a static timing and noise analysis tool is further enhanced to not only generate ECO constraints, but to also automatically invoke and operate a normal (i.e. not enhanced) place & route tool to identify the best ECO techniques applicable to the layout, and then outputs the ECO techniques as commands to the place & route tool. Examples of commands to the normal place & route tool that are generated in such alternative embodiments are re-sizing a cell, inserting a buffer, or rerouting wires. Hence the alternative embodiments may implement all aspects of the invention in a super-enhanced static timing and noise analysis tool (which contains therein a version of softwares 999A and 999B), followed by use of a normal place & route tool that is unchanged (i.e. same as the prior art).

Figure 1A:
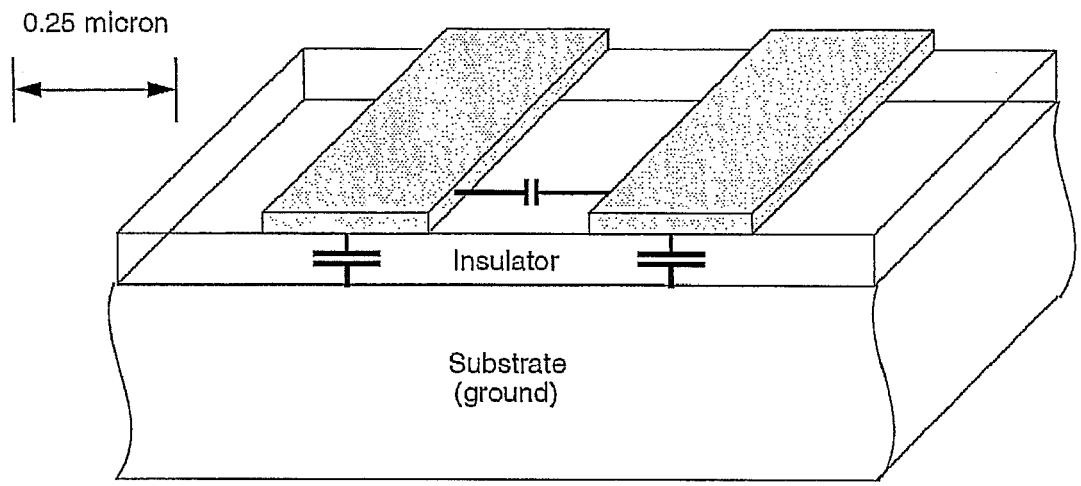
FIGS. 1A and 1B illustrate prior art IC designs showing an enlarged view of two parallel metal interconnections with FIG. 1A for a 0.25-micron technology and FIG. 1B for a 0.13-micron technology. Note that the drawings are merely representative and not to any particular scale.
Figure 1B:
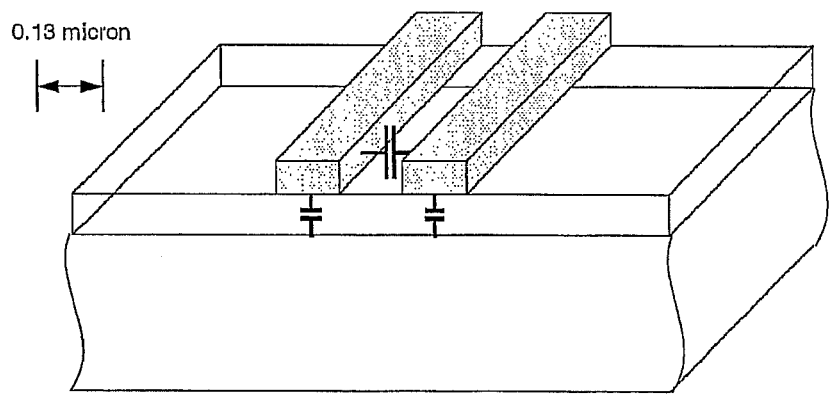
Figure 1C:
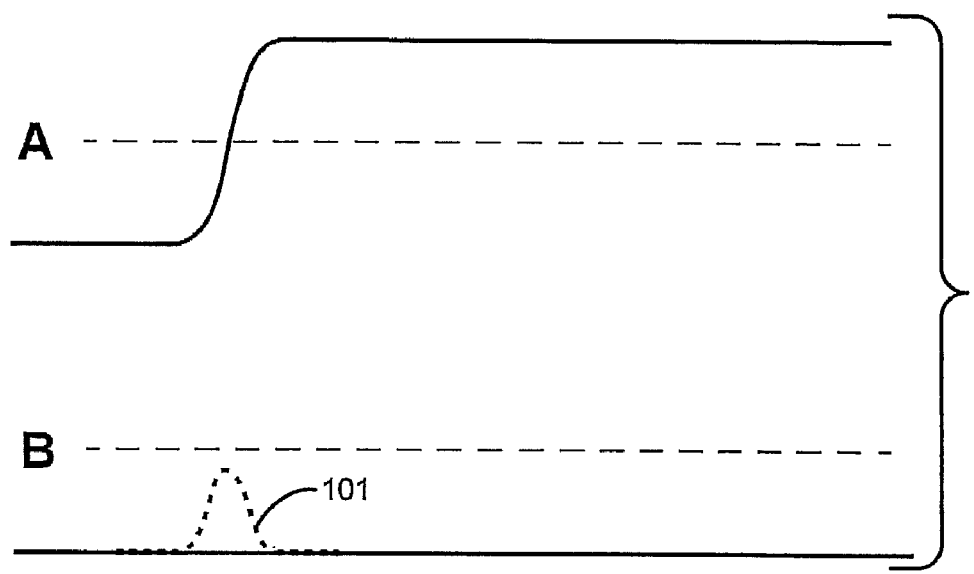
FIGS. 1C and 1D illustrate waveforms showing delay due to capacitive cross coupling in prior art.
Figure 1D:
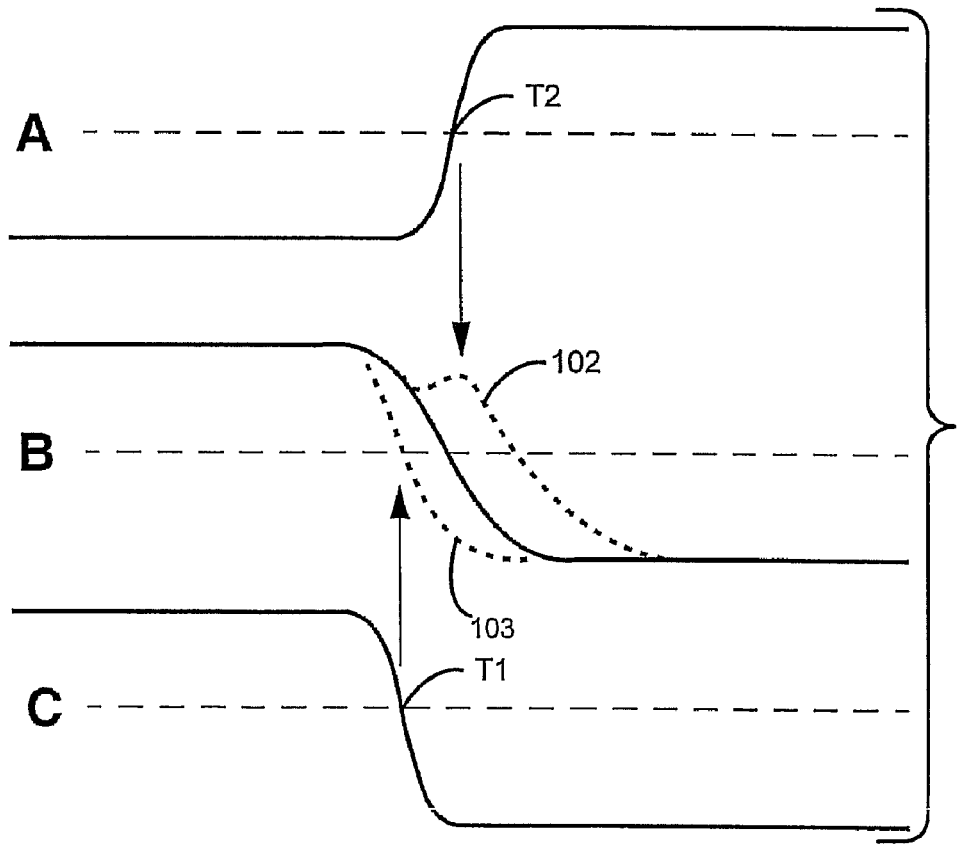
Figure 1E:
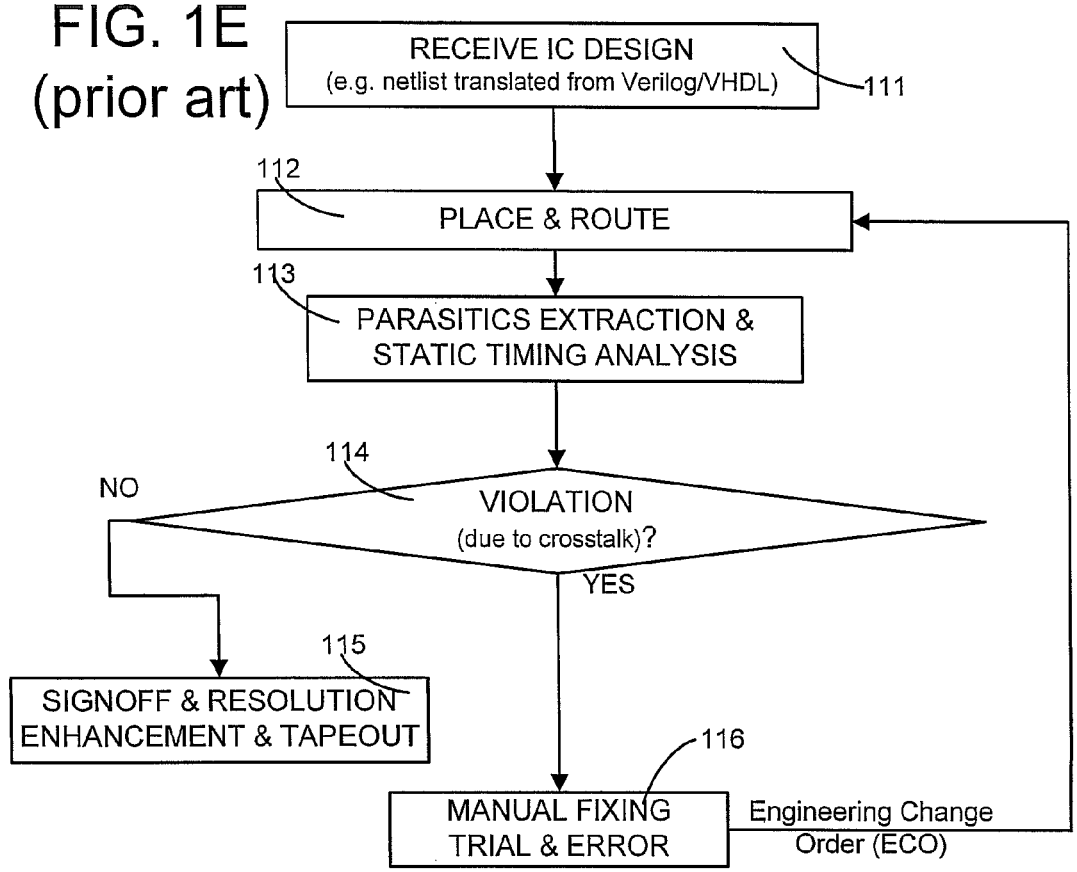
FIG. 1E illustrates, in a flow chart, a method for correcting crosstalk induced timing violations in an IC design in a prior art method.
Figure 1F:
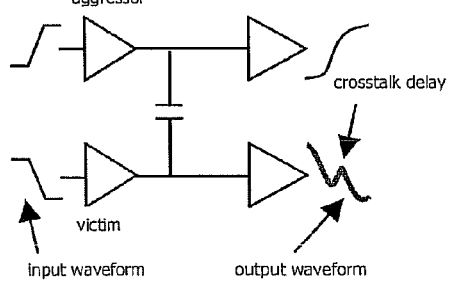
FIGS. 1F and 1G respectively illustrate an original coupled net and a modified net using an upsized driver to address the coupling, in the prior art.
Figure 1G:
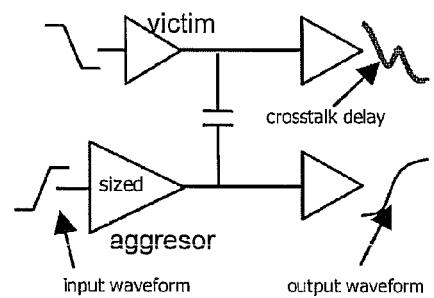
Figure 1H:
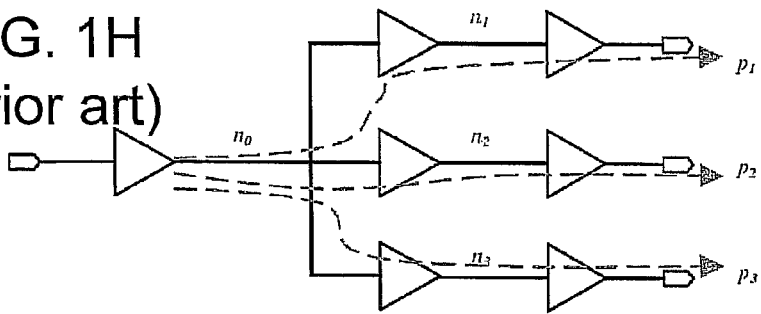
FIG. 1H illustrates a tree network with three nets in three timing paths.
Figure 2A:
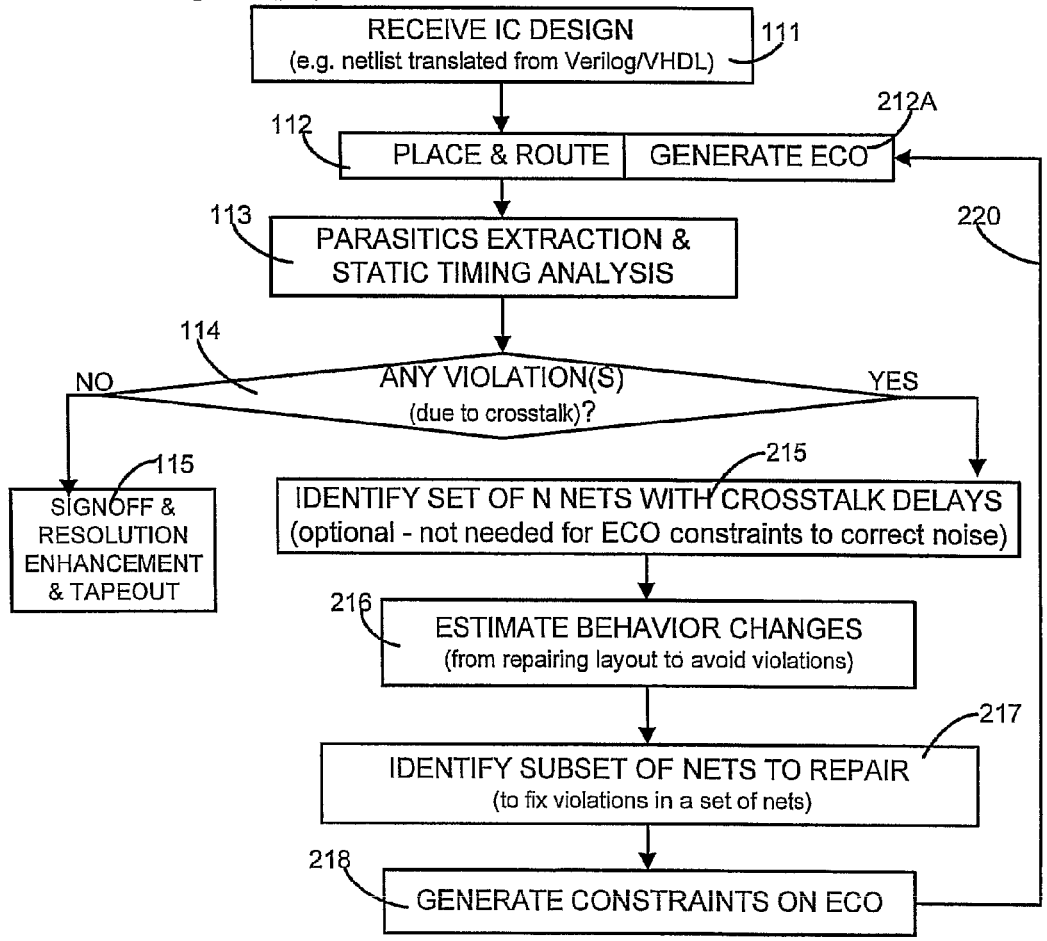
FIGS. 2A and 2B illustrate, in a high-level flow chart, a method performed by a computer programmed to automatically generate Engineering Change Order (ECO) constraints and use them in selecting ECO repair techniques.
Figure 2B:
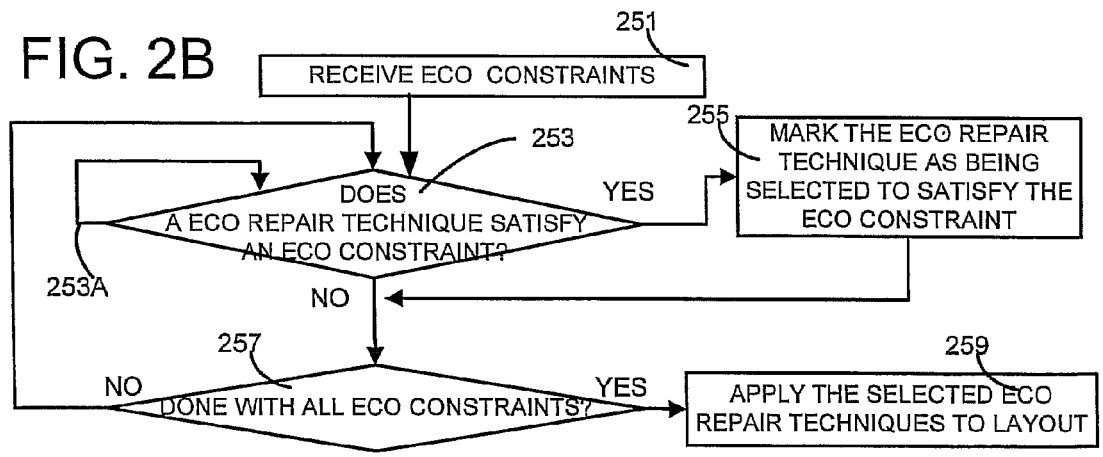
Figure 3A:
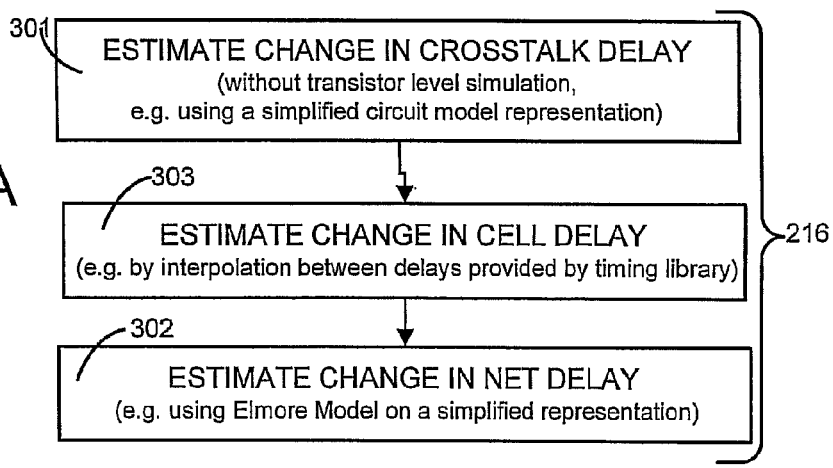
FIG. 3A illustrates in an intermediate-level flow chart, a method performed by the computer of FIG. 2A when estimating behavior changes from repairing a layout to avoid violations (see act 216) in some embodiments of the invention.

Several embodiments use three acts 301-303 as shown in FIG. 3A to perform act 216 of FIG. 2A before the actual ECO operation. Specifically, estimation of ECO-driven change in delay is performed in act 216 as follows in some embodiments. One ECO repair technique requires upsizing a victim cell (driver), which changes its crosstalk delay as well as the crosstalk delays of the aggressors of that victim. Moreover, this ECO repair technique also changes the previous stage delay and current stage delay due to input capacitance and driver resistance changes. Hence, to upsize one victim cell, the computer is programmed to estimate in act 216 the following delays: previous stage cell delay 331 (see FIG. 3B) previous stage net delay 332, new sized victim cell delay 311, victim net delay and victim net crosstalk delay (together shown as 312), and aggressor nets crosstalk delay 321.

Another ECO repair technique requires buffer insertion, whose effect on delay is estimated similar to cell upsizing except for adding a buffer cell delay. Let $d_{ps}$ and $d_{cs}$ denote the original previous and current stage delays, and $d_{ps}'$ and $d_{cs}'$ denote the estimated previous stage and current stage delays. Then, estimated delay change $\Delta d$ is computed as:

$$\Delta d = d_{ps} + d_{cs} - d_{ps}' - d_{cs}' \quad (1)$$

Figure 3B:
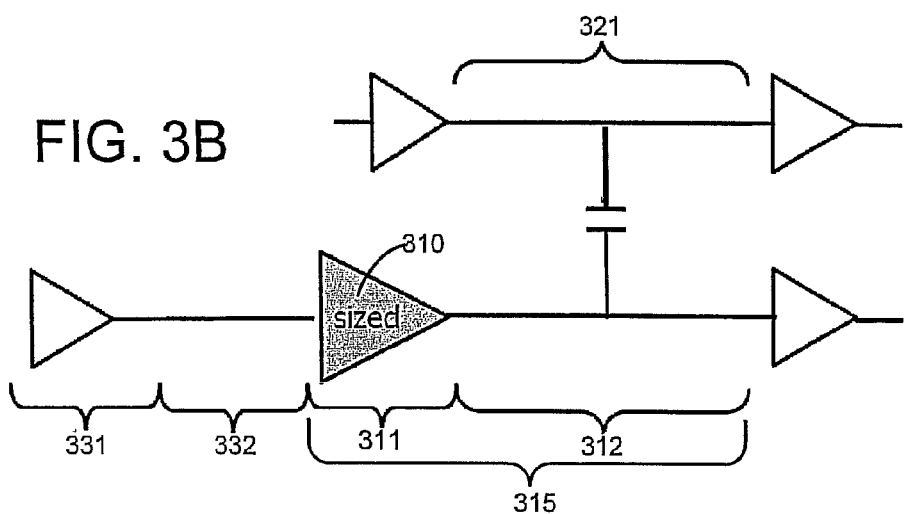
FIG. 3B illustrates, individual components of delay changes that are estimated in some embodiments of the type illustrated in FIG. 3A, when a cell in a victim net is resized.

Specifically, act 301 computes ECO caused change in crosstalk delay in an aggressor net (see 321 in FIG. 3B) as well as in the victim net (shown together with net delay of the victim as 312 in FIG. 3B). Act 302 computes change in net delay of the victim (see 312 in FIG. 3B) as well as of the net delay of the previous stage (see 332 in FIG. 3B). And act 303 computes changes in cell delay of the victim net (see 311) as well as the previous stage (see 331). Depending on the previous stage delays 331 and 332, an input signal to the driver 310 of the victim net may itself be delayed and this is also taken into account (e.g. when summing up delays). Note that ECO repair techniques may change the input capacitance as well as the strength of the driver 310. After all such delays are computed and summed up; the change in delay due to ECO repair is obtained.

In some embodiments, the amount of re-sizing of a victim cell is determined by finding a cell in the technology library which performs the same function as the victim cell but satisfies a predetermined criterion on one or more delays in the victim net, such as crosstalk delay and/or stage delay. Certain embodiments use as the predetermined criterion an X % reduction in crosstalk delay and a Y % reduction in stage delay. Note that as stage delay includes crosstalk delay as one of its components Y<X. Examples of X and Y are 50% and 10% respectively.

In an illustrative example, a cell (denoted as "L1" for being first alternate) larger than the victim cell is tested for its use in the victim net and its estimates result in 10% and 1% improvement in crosstalk delay and stage delay. As each of these two values are less than the corresponding predetermined criterion values of 50% and 10% respectively, the process is repeated. In this example, another cell (denoted as L2 for being the second alternate) larger than the first alternate L1 is tested and its estimates result in 30% and 2% improvement which are still below the corresponding predetermined criterion values of 50% and 10% respectively, the process is once again repeated. In this example, yet another cell (denoted as L3 for being the third alternate) larger than the second alternate L2 is tested and its estimates result in 60% and 8% improvement. Since the crosstalk delay improvement exceeds the corresponding predetermined criterion value of 50% this cell L3 is rejected and L2 is selected as being the cell to use in upsizing the victim cell.

Note that the just described process is performed when determining the ECO constraints to be generated (in software 999A) and hence it is unrelated to any process that may be performed in modifying the IC design (in software 999B). There is a tradeoff in the values of X and Y, analyzed as follows. If the X and Y values are set (e.g. by an IC chip designer) to be too large, the resized cells may become too large to fit within the physical space available in the layout. If the X and Y values are set to be too small, then the number of ECO repairs that are needed is likely to increase and may not be possible (e.g. due to lack of convergence). Some embodiments use as default, the values of 50% and 10% for X and Y respectively.

Act 217 is thereafter performed, to minimize the number of ECO repairs that are required, because fixing a single net may fix timing violations in multiple paths that contain that single net so that other nets in these paths need not be fixed, thereby to reduce the chance of perturbing other parts of the design. Finally, as per act 218, one or more ECO constraints are generated which are then sent from the timing & noise analyzer to the place & route tool.

Figure 4A:
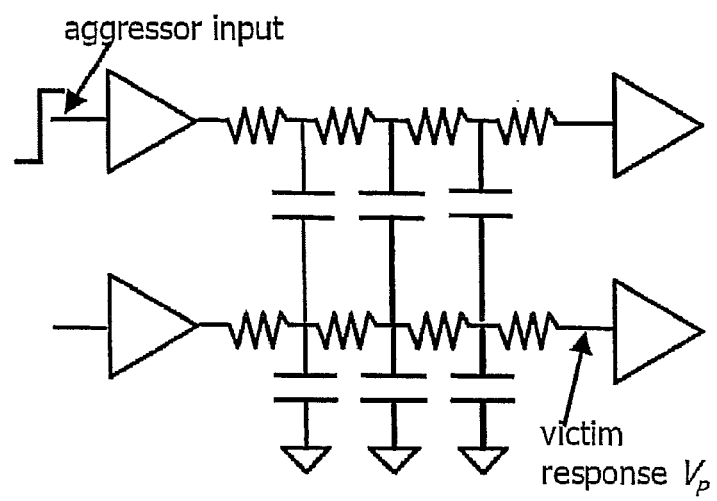
FIGS. 4A and 4B respectively illustrate an original coupled net of the prior art, and a simplified representation thereof used to estimate crosstalk delay by a computer in some embodiments of the invention.
Figure 4B:
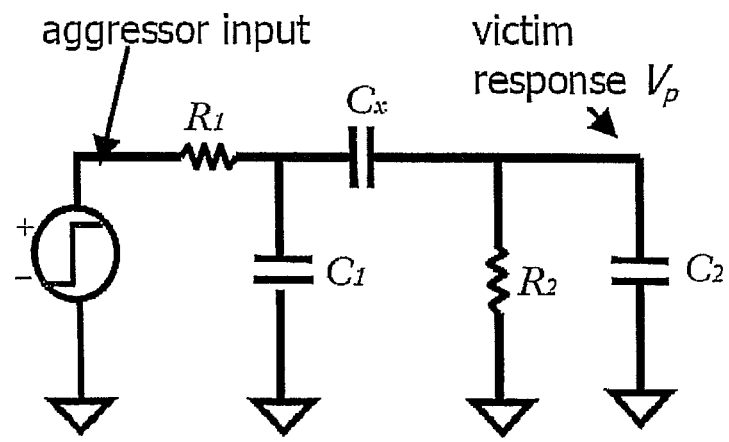

The acts 301-303 shown in FIG. 3A of some embodiments are very fast and only require a few additions and multiplications. They are selected to be sufficiently accurate to guide an ECO repair decision, when combined with scaling as discussed next. Act 301 of some embodiments uses a simplified circuit model representation as illustrated in FIG. 4B, for an original circuit shown in FIG. 4A. More details on this model are described in detail in an article by A. Vittal and M. Marek-Sadowska, "Crosstalk Reduction for VLSI," IEEE Trans. on CAD, vol. 16, no. 3, pp. 290-298, 1997 that is incorporated by reference herein in its entirety.

The just-described model (in the previous paragraph) produces an upper bound for crosstalk glitch height $V_P$ as calculated by equation (2) below. In this equation (2), $R_1$ is an aggressor cell's resistance, and $C_1$ is the aggressor cell's load capacitance (computed as the sum of the aggressor net's wire capacitance and all pin capacitances of the aggressor net). $C_X$ is the total coupling capacitance between the aggressor net and the victim net. $R_2$ is the victim cell's resistance. $C_2$ is the victim cell's load capacitance (computed as the sum of the victim net's wire capacitance and all pin capacitances of the victim net). $V_{DDa}$ represents the voltage rail of the aggressor net. This model is used in some embodiments because it provides a closed form equation for bump (i.e. glitch) height and can be evaluated much quicker than an iterative calculation.

$$V_P = \frac{V_{DDa}}{1 + \frac{C_2}{C_X} + \frac{R_1}{R_2}\left(1 + \frac{C_1}{C_X}\right)} \quad (2)$$

Note that although equation (2) is provided as an illustration of an estimator that is used in some embodiments of the invention, other embodiments use other estimators that are more accurate or less accurate and correspondingly slower or faster, depending on tradeoffs between speed, accuracy, memory size, number of iterations etc. Three illustrative methods that are used in other embodiments of estimators are described in the following three articles, each of which is incorporated by reference herein in its entirety: (1) Guardiani, et al, "Modeling the effect of wire resistance in deep sibmicron coupled interconnects for accurate crosstalk based net sorting", Proc. of PATMOS, pp 287-296, October 1998; (2) Davide Pandini, et al, "Network Reduction for Crosstalk Analysis in Deep Submicron Technologies", International Workshop on Timing Issues, 1997; and (3) A. Odabasioglu, M. Celik, and L. Pileggi, "PRIMA: Passive Reduced-Order Interconnect Macromodeling Algorithm," IEEE Trans. on CAD, vol. 17, no. 8, pp. 645-654, 1998.

After applying this equation (2) for each aggressor and getting individual glitch heights caused by each aggressor, the computer is further programmed to add them up, to obtain a total glitch height (based on the superposition principle). Although this value is just a first order approximation and doesn't represent the exact glitch height in the victim net, it is nonetheless computed and it is used in act 301 in some embodiments, specifically by interpolation (via scaling). Alternative embodiments of act 301 (FIG. 3A) obtain an exact value by transistor level simulation or any other method such as PRIMA described in the following article by A. Odabasioglu, M. Celik, and L. Pileggi, "PRIMA: Passive Reduced-Order Interconnect Macromodeling Algorithm," IEEE Trans. on CAD, vol. 17, no. 8, pp. 645-654, 1998 that is incorporated by reference herein in its entirety.

Figure 5A:
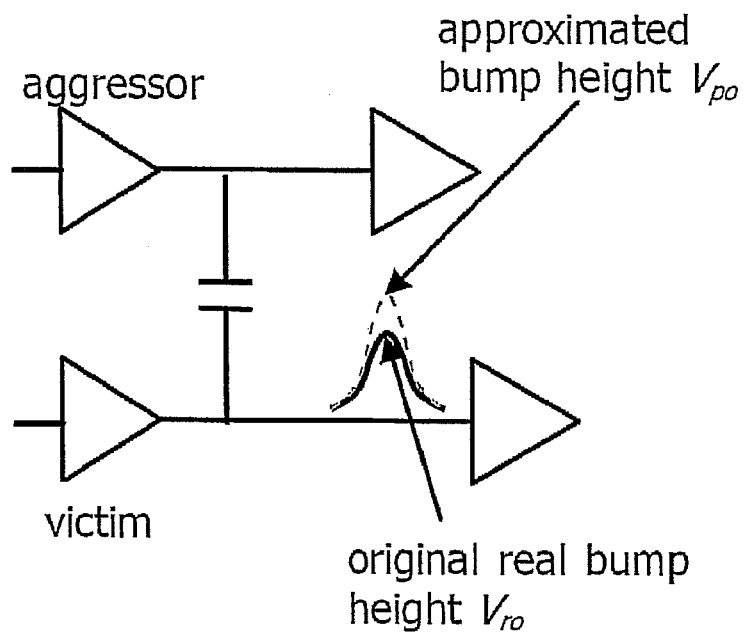
FIGS. 5A and 5B respectively illustrate another original coupled net in the prior art, and a modified net using an upsized driver to reduce height of a glitch (or bump) caused by coupling in some embodiments of the invention.
Figure 5B:
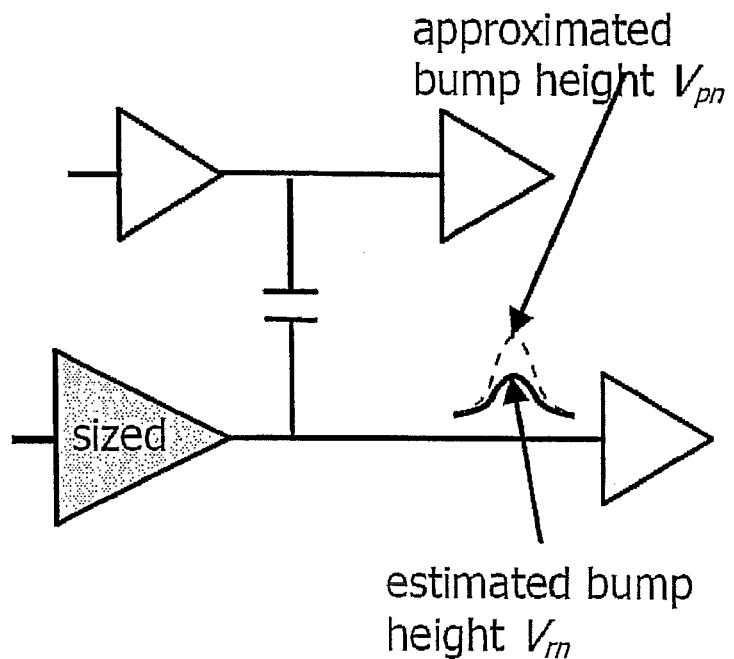

FIGS. 5A and 5B show a prior art original coupled network in FIG. 5A and the same network with its victim driver cell upsized in FIG. 5B. Note that the other network values such as coupling capacitance, net resistance and capacitance remain the same. The computer is programmed in some embodiments of act 301, to assume that re-sizing of a victim cell only changes the victim cell's resistance, so any change in crosstalk glitch height is only due to this change. With this assumption, the computer performs act 301 to estimate a new crosstalk delay of the new victim cell. By the time act 301 is performed, timing analysis has been already performed for the original net and hence $V_{ro}$ is obtained from the static timing and noise analysis tool as an accurate glitch height for the original network.

In the following description, $V_{po}$ and $V_{pn}$ represent approximated glitch height values obtained from application of equation (2) for the original and sized network respectively. Note that $V_{pn}$ is typically smaller than $V_{po}$ because driver resistance of a larger cell is smaller, i.e., in equation (2), $R_2$ of the new victim cell is smaller than that of the original victim cell. Also, in the following description $V_{ro}$ and $V_{rn}$ represent the exact glitch height for the original and new network respectively. Similarly $V_{rn}$ is typically smaller than $V_{ro}$ due to the new smaller driver resistance. Hence, many embodiments of act 301 approximate the value $V_{rn}$, by assuming that a ratio of the approximated and actual glitch heights remains constant as shown in equation (3) below.

$$V_{rn} = \frac{V_{pn}}{V_{po}} V_{ro} \quad (3)$$

Figure 6A:
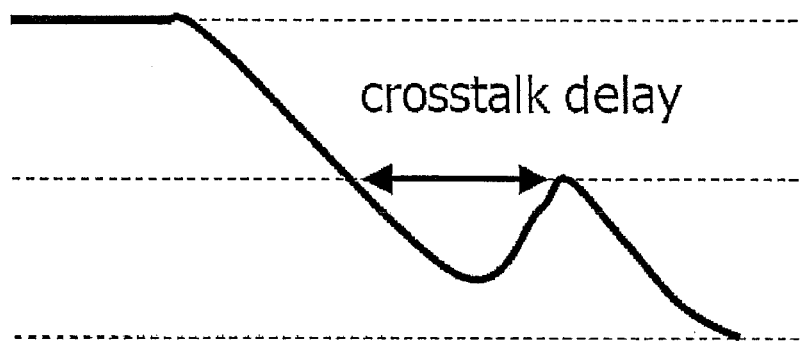
FIGS. 6A and 6B respectively illustrate measured crosstalk delay of the prior art and estimated crosstalk delay in some embodiments of the invention.
Figure 6B:
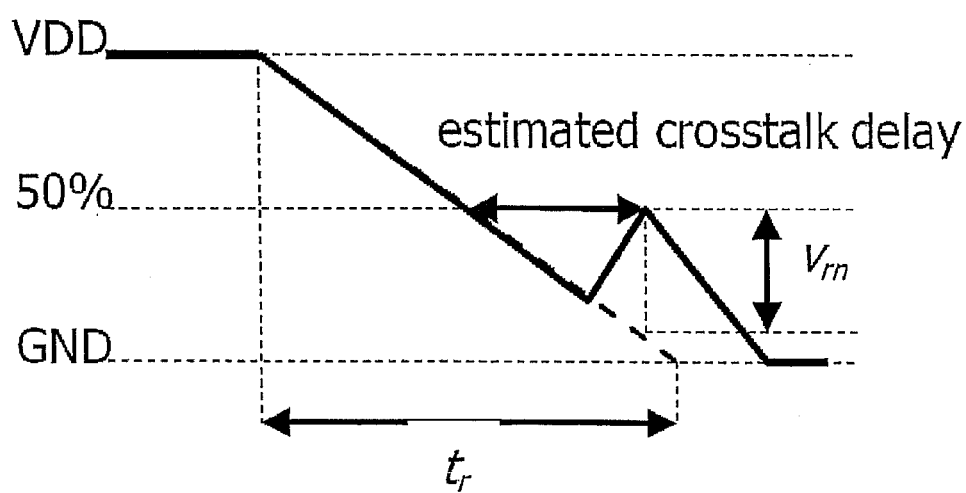

In some embodiments $V_{ro}$ is computed by use of a circuit simulator (e.g. SPICE) and hence it is known at this stage. Therefore, act 301 easily obtains $V_{rn}$ by applying the above equation (3). Then, act 301 computes crosstalk delay with the approximation shown in FIGS. 6A and 6B. Specifically, by aligning the crosstalk glitch on the slope of the victim, act 301 estimates the crosstalk delay using equation (4) below. In the following equation (4), value d represents the estimated crosstalk delay, and $t_r$ the full rail to rail transition time of the victim. $V_{DDv}$ represents the voltage rail of the victim net. This formulation allows the victim and aggressor nets to be at different rail voltages.

$$d = t_r \cdot \frac{V_{rn}}{V_{DDv}} \quad (4)$$

Substituting value $V_{rn}$ in equation (4) from equation (3), allows computation (in act 301) of the crosstalk delay as shown in the following equation (5):

$$d = \frac{t_r}{V_{DDv}} \cdot \frac{V_{pn}}{V_{po}} V_{ro} \quad (5)$$

Figure 7A:
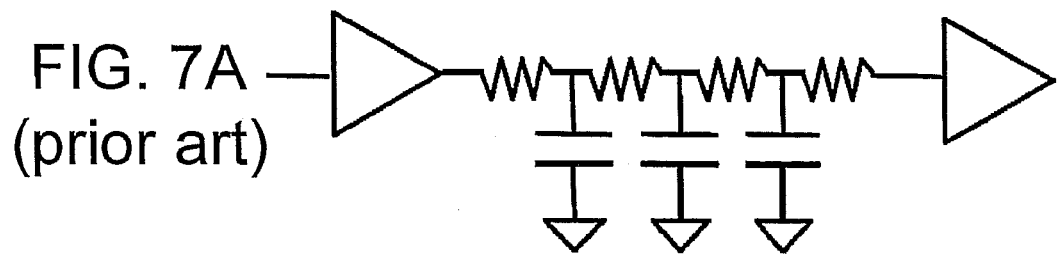
FIGS. 7A and 7B respectively illustrate an original RC net of the prior art, and a simplified representation thereof used to estimate net delay by a computer in some embodiments of the invention.
Figure 7B:
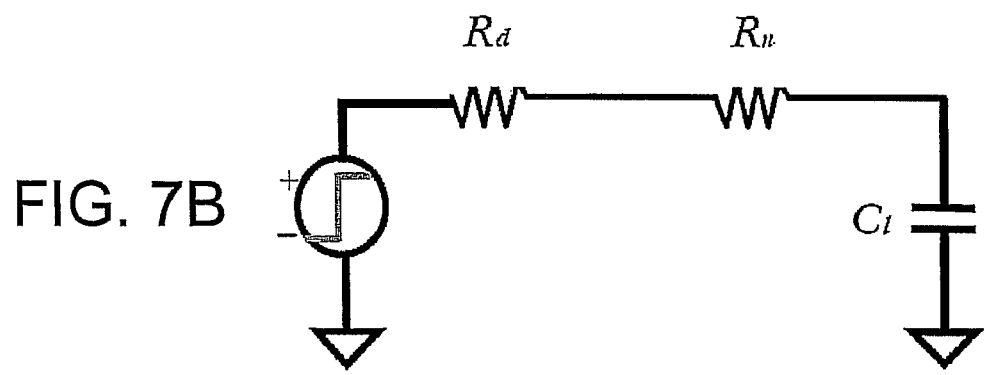

FIGS. 7A and 7B illustrate a typical RC network in FIG. 7A and its simplified representation used for estimation by act 302 in FIG. 7B. In this model, $R_d$ denotes resistance of a driver cell (left most inverter in FIG. 7A), $R_n$ denotes total resistance of the net, and $C_n$ denotes total capacitance of the net (obtained by summing up the total wire capacitance and all pin capacitances). Elmore delay representation of the simplified model is used in some embodiments of act 302 to obtain an estimation of the net delay (also called "wire delay") by use of the following equation (6):

$$d_{Elmore} = (R_d + R_n) \cdot C_n \quad (6)$$

Act 302 is performed in some embodiments where a victim cell of the circuit shown in FIG. 7A is upsized. Since only the victim driver is replaced, the victim driver resistance is the only change in the new network, which is designated by $R_d'$. In this case, Elmore delay of the new network is computed by certain embodiments of act 302 as per the following equation (7):

$$d_{Elmore}' = (R_d' + R_n) \cdot C_n \quad (7)$$

In the following equation, $d_n$ denotes the original net delay of the circuit shown in FIG. 7A. Applying equations (6) and (7), some embodiments of act 302 estimate a new net delay $d_n'$ (after up-sizing the victim cell) by use of the following equation (8):

$$d_n' = \frac{d_{Elmore}'}{d_{Elmore}} \cdot d_n \quad (8)$$

Equation (8) is also used in several embodiments of act 302 to estimate the previous stage delay change where input pin capacitance is changed. In this case, the total net capacitance $C_n$ is changed while the resistance remains same in the original and the new network.

In several embodiments, the static timing and noise analysis tool does not have access to the layout of the IC design, and therefore these embodiments use cell upsizing as a technique to estimate the ECO constraints. In some alternative embodiments, the static timing and noise analysis tool has access to the layout of the IC design generated by the place and route tool. Hence, the just-described alternative embodiments use the layout to test out other techniques, such as wire re-routing (increased wire spacing) and/or wire re-sizing (reduced wire length), to estimate the ECO constraints. Note that such layout-based techniques for ECO repair may be used alone individually or in combination with one another and/or with the above-described cell upsizing.

For example when applying wire re-routing, the static timing and noise analysis tool tests out increase in wire spacing by 1P, 2P, 3P etc from the victim net, to find an appropriate value that meets the predetermined constraint(s), wherein P is the pitch between adjacent wires. These alternative embodiments provide to an enhanced place and route tool with not only an ECO constraint but also an identification of the technique (or combination of techniques) used to prepare the ECO constraint. The enhanced place and route tool of such alternative embodiments then uses the identified technique(s) to modify the layout to achieve the specified ECO constraints.

Figure 8:
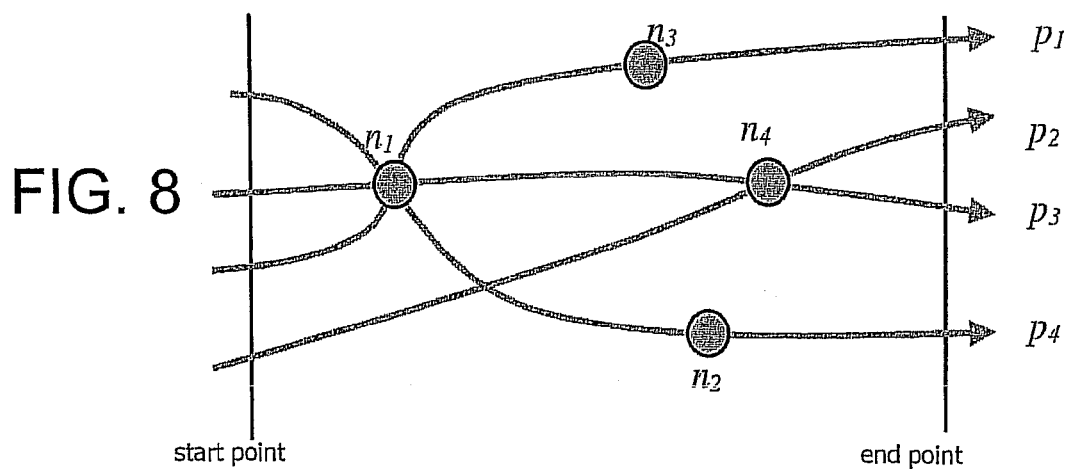
FIG. 8 illustrates a circuit having four violating timing paths p1-p4 (shown as arrows), and four nets n1-n4 that have crosstalk delays (shown as nodes) formulated into an NP complete problem in accordance with the invention.

Act 217 is performed in some embodiments to identify a subset of nets to be repaired from among a set of nets that contribute delay to a number of paths. Specifically, the computer's objective in act 217 is to find a minimum set of nets to be repaired to fix all timing violations of the paths. An example configuration of nets and paths that are optimized by act 217 is shown in FIG. 8 wherein four timing paths $p_1, p_2, p_3$ and $p_4$ with timing violations due to crosstalk delays at nets $n_1, n_2, n_3$ and $n_4$, as shown in FIG. 8, and their path slacks are all negative, i.e., −1 ns, −2 ns, −2 ns and −1 ns respectively. In the figure, for simplicity, nodes represent cross coupling nets, and any nets without cross coupling are omitted from the paths. Assume repairing crosstalk at $n_1$, $n_2$, $n_3$ and $n_4$ can reduce net delay by 1 ns, 2 ns, 1 ns, and 2 ns respectively. Then, consider two sets of nets N1 and N2 as follows.

$$N_1=\{n_1,n_4\}$$

$$N_2=\{n_2,n_3,n_4\} \quad (9)$$

Both set $N_1$ and set $N_2$ can repair all violations of the paths, but $N_1$ has less number of nets to repair because $n_1$ and $n_4$ are more critical in terms of crosstalk impact. The computer is programmed in act 217 to identify such critical nets to minimize the number of repairs. In several embodiments, the computer is programmed to formulate an NP-complete problem to achieve this objective.

In certain embodiments of the type discussed next, the computer formulates this problem using Integer Linear Programming (ILP), and then applies a heuristic to solve this problem. These embodiments start with a set of timing violation paths P and a set of nets with coupled nets on P, and formulate a problem of minimization of the number of repairs of the nets, using Integer Linear Programming as follows. In the following formulation, M denotes the number of paths that have to be repaired and N denotes the number of repairable nets on the paths. The computer is programmed in act 217 to set up in its memory an M×N matrix called connectivity matrix C in which elements are defined as $c_{ij}$:

$$c_{ij} = \begin{cases} 1 & \text{when net } j \text{ can contribute to repair of path } i \\ 0 & \text{other wise} \end{cases} \quad (10)$$

The computer is further programmed in act 217 to set up in its memory an N×N matrix called repairable net budget matrix R in which elements are defined as $r_{ij}$:

$$r_{ij} = \begin{cases} \Delta d_j & \text{when } i = j \\ 0 & \text{other wise} \end{cases} \quad (11)$$

where $\Delta d_j$ is the amount of estimated repaired delay for net j computed in act 216 by use of equation (1). The computer is also programmed in act 217 to set up in its memory an N×1 matrix called repair decision vector x, where its elements are defined as:

$$x_j = \begin{cases} 1 & \text{when net } j \text{ is used for repair} \\ 0 & \text{other wise} \end{cases} \quad (12)$$

Finally, the computer is also programmed in act 217 to set up in its memory an M×1 matrix called required repair amount matrix S in which elements are defined as:

$$s_i = \text{the amount of delay repair required for path i} \quad (13)$$

Hence, an element $s_i$ in required repair amount matrix S is the absolute value of the negative slack of path i. The computer is also programmed in act 217 to formulate an ILP problem as follows:
minimize |x| such that $$CRx - S > 0$$

$$x \geq 0 \quad (14)$$

On minimizing |x| in act 217, the computer automatically minimizes the number of repairs. For example, matrices in the computer's memory that represent FIG. 8 during performance of act 217 in some embodiments are:

$$C = \begin{bmatrix} 1 & 0 & 1 & 0 \\ 0 & 0 & 0 & 1 \\ 1 & 0 & 0 & 1 \\ 1 & 1 & 0 & 0 \end{bmatrix} \quad R = \begin{bmatrix} 1ns & 0 & 0 & 0 \\ 0 & 2ns & 0 & 0 \\ 0 & 0 & 1ns & 0 \\ 0 & 0 & 0 & 2ns \end{bmatrix} \quad S = \begin{bmatrix} 1ns \\ 2ns \\ 2ns \\ 1ns \end{bmatrix} \quad (15)$$

Moreover, $N_1$ and $N_2$ are represented by $x=[1\ 0\ 0\ 1]^T$ and $x=[0\ 1\ 1]^T$. Both of them satisfy (14) as will be apparent to the skilled artisan, in view of this disclosure. However, ILP is an intractable problem. In the next section, we propose a heuristic algorithm that efficiently determines the repairs.

In some embodiments of the invention, the computer uses a heuristic to solve equation (14) in an iterative fashion. In the following description, $x_k$ represents x in the kth iteration, and the computer is programmed with the assumption that only one element in x can be equal to 1 in each iteration. Equation (14) re-written in an iterative manner is as follows:

$$S_{k+1} = S_k - CRx_k. \quad (16)$$

Since $|x_k|=1$ in each iteration, the iteration process is continued until all elements in $S_k$ would become less or equal to zero. To guide selecting an element of $x_k$ in the kth iteration, the computer is programmed to use in act 217, a 1×N matrix B where its elements are defined as $b_j$:

$$b_j = \sum_{i=1}^{M} c_{ij}. \quad (17)$$

where bj represents the number of paths going through net j. Now, the computer generates an 1×N matrix called repair guide matrix D as follows:

$$D = BR. \quad (18)$$

In this matrix D, $d_j$ denotes the jth element of D. Then $d_j$ is the total amount of repair for all the paths going through net j when it is repaired. The larger $d_j$ is, the more paths can be repaired. Thus, we use the elements in D to guide to determine $x_k$. In other words, we choose net j for repair in such a way that $d_j$ is the kth largest values in D. Since the iteration stops when $S_k$ becomes zero or below, k is equal to or less than N. Suppose the iteration stops at Lth iteration. The final solution x is:

$$X = X_1 + X_2 \ldots + X_L \quad (19)$$

The heuristic is applied to the example shown in FIG. 8 as follows. At this stage, the computer has already determined C, R, and S as per equation (15) above. Then the computer finds B and D by using equations (17) and (18) as follows.

$$B = [3\ 1\ 1\ 2]$$

$$D = BR = [3\ 2\ 1\ 4] \quad (20)$$

The largest element in D is the fourth element $d_4$, and for this reason, the computer selects $n_4$ as the first repair candidate, i.e., $x_1 = [0\ 0\ 0\ 1]^T$. The second largest element is $d_1$, thus the computer selects $x_2 = [1\ 0\ 0\ 0]^T$ as the next repair candidate. The computer starts with $S_1$ that is the same as S in equation (15). In a first iteration of the heuristic, the computer computes as follows:

$$S_2 = S_1 - CRx_1$$

$$= \begin{bmatrix} 1ns \\ 2ns \\ 2ns \\ 1ns \end{bmatrix} - \begin{bmatrix} 1 & 0 & 1 & 0 \\ 0 & 0 & 0 & 1 \\ 1 & 0 & 0 & 1 \\ 1 & 1 & 0 & 0 \end{bmatrix} \begin{bmatrix} 1ns & 0 & 0 & 0 \\ 0 & 2ns & 0 & 0 \\ 0 & 0 & 1ns & 0 \\ 0 & 0 & 0 & 2ns \end{bmatrix} \begin{bmatrix} 0 \\ 0 \\ 0 \\ 1 \end{bmatrix}$$

$$= \begin{bmatrix} 1ns \\ 0 \\ 0 \\ 1ns \end{bmatrix}$$

In the second iteration the computer computes as follows:

$$S_3 = S_2 - CRx_2$$

$$= \begin{bmatrix} 1ns \\ 0 \\ 0 \\ 1ns \end{bmatrix} - \begin{bmatrix} 1 & 0 & 1 & 0 \\ 0 & 0 & 0 & 1 \\ 1 & 0 & 0 & 1 \\ 1 & 1 & 0 & 0 \end{bmatrix} \begin{bmatrix} 1ns & 0 & 0 & 0 \\ 0 & 2ns & 0 & 0 \\ 0 & 0 & 1ns & 0 \\ 0 & 0 & 0 & 2ns \end{bmatrix} \begin{bmatrix} 1 \\ 0 \\ 0 \\ 0 \end{bmatrix}$$

$$= \begin{bmatrix} 0 \\ 0 \\ -1ns \\ 0 \end{bmatrix}$$

Since all elements in $S_3$ are smaller or equal to 0, the computer now stops iterating, i.e. at the second iteration. The computer determines the final solution x as follows:

$$X = X_1 + X_2 = [1\ 0\ 0\ 1]^T \quad (21)$$

which is the same as $N_1$ in equation (9).

Note that although the ILP problem is NP-complete, a heuristic of the type described herein reduces its solution time by using matrix operations that are linear in solution time, as will be apparent to a person skilled in computer programming. Any sorting algorithm can be used to sort the matrix elements. For example, some embodiments of act 217 use Quick sort. Note that in practice, if an IC design is in sign off condition and has only a handful of violations, then M is much greater than N.

Figure 10:
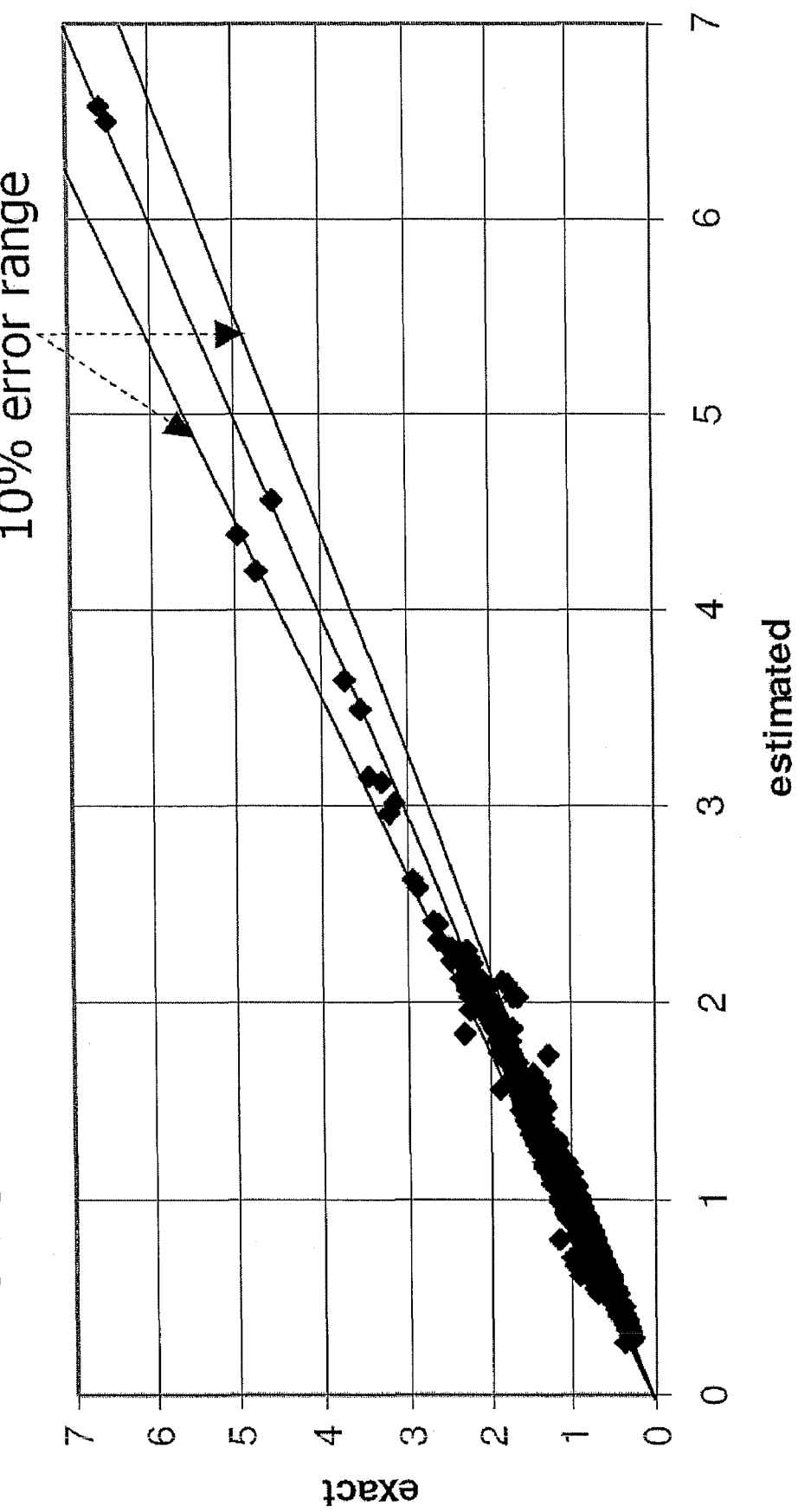
FIG. 10 illustrates, in a graph, estimated stage delay along the x-axis in some embodiments of the invention, plotted as a function of exact stage delay along the y-axis.

Several experiments have been performed to study the feasibility of the method illustrated in FIG. 2A. In one experiment, the ECO change estimation is used to predict a new crosstalk delay when a victim cell is replaced by a cell that has about half of the original cell's resistance. A design with half a million gates in 90 nm process was used, and the worst 10,000 nets with crosstalk delays were identified and their victim drivers were replaced with new cells, and estimated new crosstalk delays. Then, exact crosstalk delays were computed using a circuit simulation tool (such as SPICE), and compared with the estimated ones as shown in FIG. 10. In the graph, horizontal axis is the estimated value and vertical axis is a real computed value. If estimation matches the real value without any error, it sits on the 45 degree line in the graph. As shown in the graph, all points are within 10% error range, and accurate enough to determine whether to re-size or insert buffers for repair.

The method illustrated in FIG. 2A was also tested with several industrial designs. Table 1 below shows details of the designs used in the experiment. All designs have from two hundred thousand to half a million cells. Two of the designs were at sign-off state and the others were relatively clean when their timings were analyzed without crosstalk with commercial static timing analysis software. However, when they were analyzed with considering crosstalk, some additional timing violations were discovered. The method illustrated in FIG. 2A was also applied to the designs and generated ECO constraints for timing repair. A commercial place and route tool was used to read these constraints and further used to implement ECO operations. The modified layout from the place and route tool was sent to parasitics extraction tool that created a new parasitics data. Then the timing analysis tool was again applied to the modified layout to analyze the timing with ECO changes. The acts in FIG. 2A were all automated so that they could be run over night without any human intervention.

Note that to evaluate some embodiments, experiments were done and three parameters were measured: worst negative slack (WNS), total negative slack (TNS) and number of endpoint violations. WNS shows the worst timing in the design. TNS shows summation of all negative slacks of the design. The method of FIG. 2A showed very good reduction ratio in all three measurement criteria. Most IC designs reach a sign-off state after a handful of iterations, e.g. two or three iterations.

Crosstalk repair in the prior art known to the inventors has been a difficult problem requiring laborious manual trial and error iterations to converge due to several issues. The method of FIG. 2A resolves such issues and enables automation of the repair process. An act 216 which performs fast estimation of behavior changes that will result from ECO operations allows act 217 to find the best repair candidates, based on predicted new timing information and a heuristic that identifies the minimum number of repairs. Experimental results show that the method of FIG. 2A can be applied to industrial designs to repair crosstalk violations, for sign-off purposes.

Figure 9B:
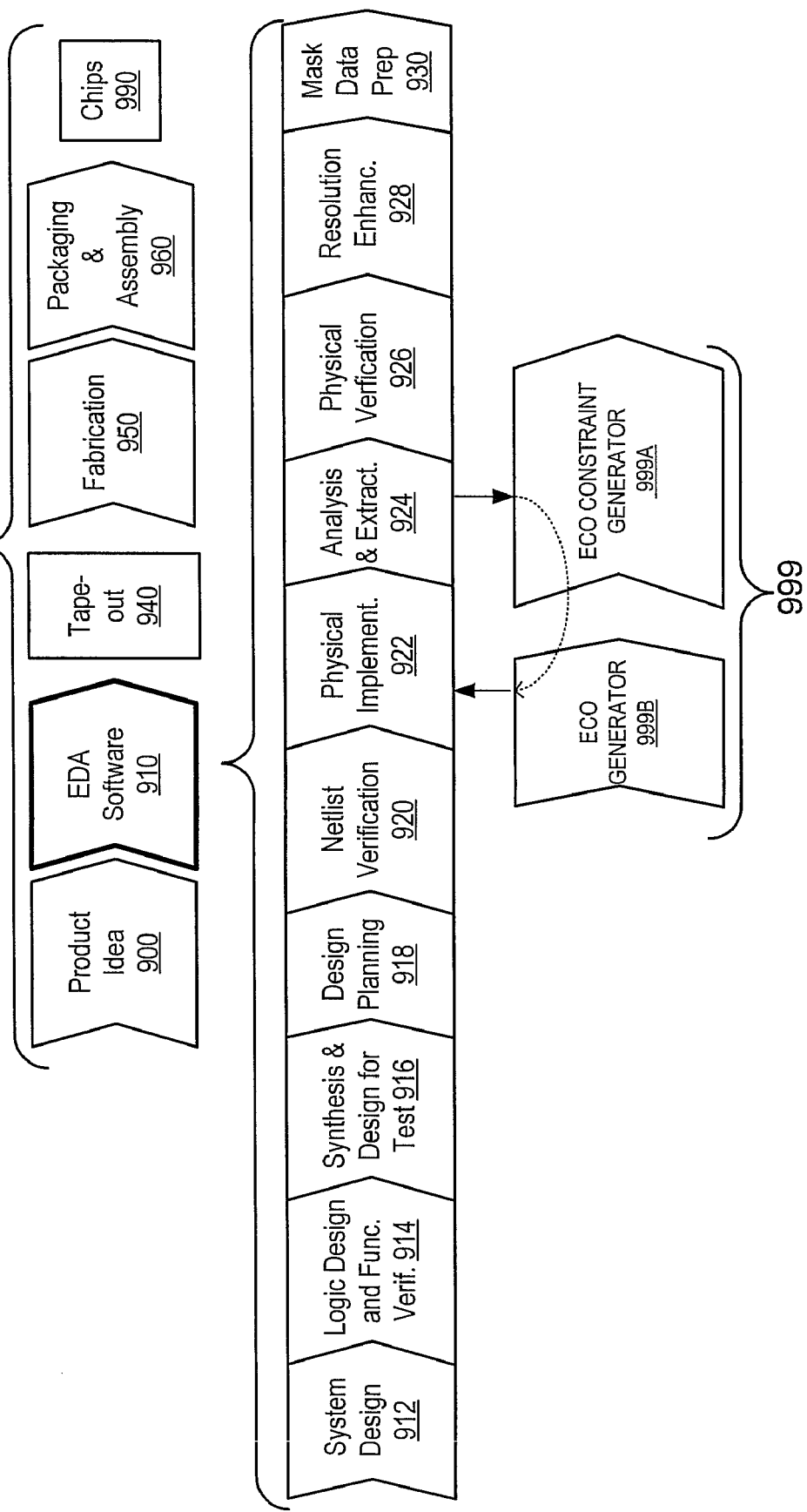
FIG. 9B illustrates, a simplified representation of an exemplary digital ASIC design flow in accordance with the invention.

Accordingly, the method of FIG. 2A is used in some embodiments of an EDA software design process (shown as 910 in FIG. 9B). Process 910 (FIG. 9B) is actually composed of a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. Exemplary EDA software products from Synopsys, Inc. that can be used at this stage include VCS, VERA, DesignWare®, Magellan, Formality, ESP and LEDA products.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler®, Tetramax, and DesignWare® products.

Design planning (stage 918): Here, an overall floorplan for the chip is constructed and analyzed for timing and top-level routing. Exemplary EDA software products from Synopsys, Inc. that can be used at this stage include Jupiter and Floorplan Compiler products.

Netlist verification (stage 920): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime® products (applied to pre-layout IC designs). Note that timing analysis at this stage is performed in PrimeTime® based on simplified models that do not take into account capacitive coupling and crosstalk.

Physical implementation (stage 922): The placement (positioning of circuit elements, such as the above-described sequential cells and combinational cells) and routing (connection of the same) occurs at this step. Exemplary EDA software products from Synopsys, Inc. that can be used at this stage include the Astro product. Note that an ECO generator 999B (of the type described above in reference to FIG. 2B) can be used in an iteration through this stage 922, as shown in FIG. 9B, after ECO constraints have been generated. Although circuitry and portions thereof (such as rectangles) may be thought of at this stage as if they exist in the real world, it is to be understood that at this stage only a layout exists in a computer 150. The actual circuitry in the real world is created after this stage as discussed below.

Analysis and extraction (stage 924): At this step, the circuit function is verified at a transistor level, this in turn permits what-if refinement. Exemplary EDA software products from Synopsys, Inc. that can be used at this includes Star RC/XT, Raphael, Aurora and PrimeTime® SI products (applied to post-layout IC designs). Note that timing analysis at this stage is performed in PrimeTime® SI based on capacitive coupling and crosstalk models. Hence, some embodiments use PrimeTime® SI at this stage to generate ECO constraints.

Physical verification (stage 926): At this stage various checking functions are performed to ensure correctness for: manufacturing, electrical issues, lithographic issues, and circuitry. Exemplary EDA software products from Synopsys, Inc. that can be used at this stage include the Hercules product.

Resolution enhancement (stage 928): This involves geometric manipulations of the layout to improve manufacturability of the design. Exemplary EDA software products from Synopsys, Inc. that can be used at this stage include iN-Phase, Proteus, and AFGen products.

Mask data preparation (stage 930): This provides the "tape-out" data for production of masks for lithographic use to produce finished chips. Exemplary EDA software products from Synopsys, Inc. that can be used at this include the CATS(R) family of products. Actual circuitry in the real world is created after this stage, in a wafer fabrication facility (also called "fab").

The data structures and software code for implementing one or more acts described in this detailed description can be encoded into a non-transitory computer-readable medium, which may be any storage medium that can hold code and/or data for use by a computer. Storage medium includes, but is not limited to, magnetic and optical storage devices such as disk drives, magnetic tape, CDs (compact discs), and DVDs (digital versatile discs) that includes instructions to perform the methods illustrated in FIGS. 2A and 2B.

Note that a computer system used in some embodiments to implement an ECO constraints generator 999A and an ECO generator 999B of the type described herein uses one or more linux operating system workstations (based on IBM-compatible PCs) and/or unix operating systems workstations (e.g. SUN Ultrasparc, HP PA-RISC, or equivalent), each containing a 2 GHz CPU and 1 GB memory, that are interconnected via a local area network (Ethernet).

Numerous modifications and adaptations of the embodiments described herein will become apparent to the skilled artisan in view of this disclosure. For example, although Integer Linear Programming (ILP) is used in some embodiments of act 217, other embodiments in accordance with the invention use other methods such as simulation annealing as described below in Appendix B. Accordingly, numerous modifications and adaptations of the embodiments described herein are encompassed by the scope of the invention.

In some embodiments, ECO constraints are transferred from an enhanced static timing analysis tool, such as PrimeTime® SI to an enhanced place and route tool, such as Astro™ as follows. The constraints are objectives that the enhanced static timing and noise analysis tool asks the enhanced place and route tool to meet in selecting appropriate ECO repair techniques. As noted above, an example of an ECO constraint is when the enhanced static timing and noise analysis tool asks the enhanced place and route tool to reduce a stage delay by 20% on a specific net, and it does not matter whether the enhanced place and route tool inserts buffers or sizes cell to reduce the stage delay by the specified amount. In some embodiments, violations related to signal integrity (SI) are addressed first, to fix timing violations. If the signal integrity repair technique doesn't correct a timing violation, then other timing repair techniques are considered. This means, for example, correction of crosstalk delay is considered first rather than reducing stage delay.

Certain embodiments start with a set of (SI bottleneck) nets that are generated by an act 215 (FIG. 2A), in an enhanced static timing and noise analysis tool. This tool then automatically generates ECO constraints to make the slacks of the paths going through the bottleneck nets positive. The ECO constraints for Signal Integrity to reduce crosstalk delays are considered first. If timings are not met after reducing the crosstalk delays, reducing stage delay is considered. Note that methods of the type described herein may also start with a set of paths with negative slacks, and generate ECO constraints to make the slacks of the paths positive.

In some embodiments, the enhanced static timing analysis tool generates two types of ECO constraints in a predetermined format (also called "ECO constraint format"). A first type of constraint specifies how much crosstalk delay reduction should be achieved for the given pin. This can be achieved by reducing bump height caused by capacitive couplings. An application programming interface (API) for this type of ECO constraint between the enhanced static timing analysis tool and the enhanced place and route tool specifies the following items of information: (1) identifier of the ECO constraint (e.g. arrival time reduction or crosstalk delay reduction or both), (2) identifier of a pin in the IC design at which the ECO repair is to be done, (3) minimum rise delay, (4) maximum rise delay, (5) minimum fall delay, and (6) maximum fall delay. If an example of ECO constraint requires 20% reduction of crosstalk delay in max rise and fall for pin U1/A, and if both rise and fall max net delays are 2 ns, then the reduction is specified as 0.4 ns for both these delays. Another example of ECO constraint specifies stage delay should be reduced by 10% for a given pin U2/B based on both rise and fall max stage delays to be 5 ns as being 0.5 ns for both these delays.

A flow of the type described above in some embodiments is designed to be applied in ECO stage, and the softwares 999A and 999B (described above) assume that there are not many paths with violations. An ideal test case is an IC design that meets the timing without SI analysis, but has a small set of violations after applying SI analysis. Thus, the method of FIG. 2A is not recommended for any designs with a large number of timing violations. Otherwise, it may result in many iterations between the static timing analysis tool and place and route tool.

Figure 11A:
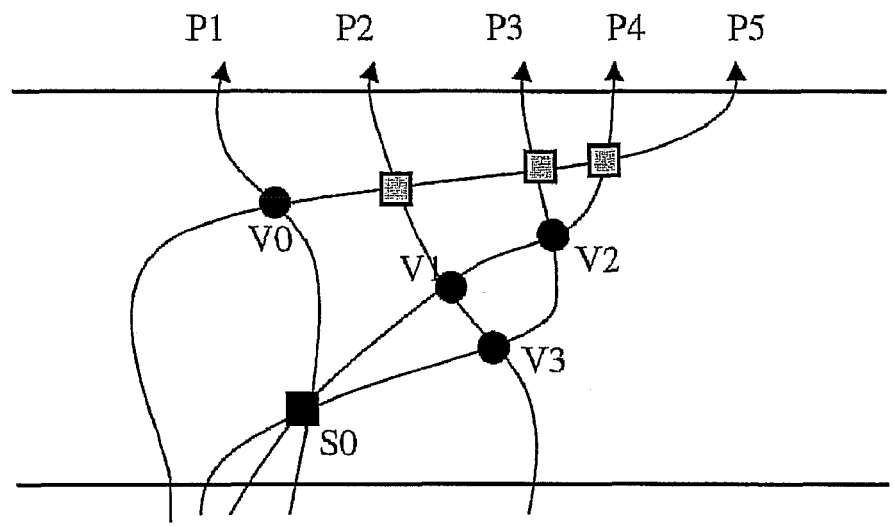
FIGS. 11A and 11B illustrate prior art circuits.

FIG. 11A shows an example scenario where four bottleneck nets have been identified. There are five paths passing through the bottlenecks with negative slacks the static timing and noise analysis tool generates a minimum set of ECO constraints that satisfy the timings after the corresponding ECO repair techniques have been applied, as follows. In FIG. 11A, circled dots (V0-V3) represent the nets identified by the bottleneck analysis. The squared dots represent timing points where multiple paths intersect each others. Since the static timing analysis tool fixes Signal Integrity problems first, the static timing and noise analysis tool generates ECO constraints to reduce rise and fall max crosstalk delays of the four bottlenecks by 0.5 ns.

Although these ECO constraints eliminate timing violations from path P2 and P5, there are still negative slacks remaining for P1, P3 and P4. At this stage, the static timing and noise analysis tool already has fixed SI violations from P1, P3 and P4; thus, the remaining fixing options are to reduce stage delays along the paths. Now the static timing analysis tool needs to find a minimum number of stage delay reductions that can remove timing violations from the paths. In this example, path P1 has ten stages along the path the static timing and noise analysis tool decides to reduce the stage delay of the net marked with black square (S0) instead of other nets because S0 has three violating paths P1, P3 and P4 passing through it. Thus, it will consequently reduce the arrival time of path P2 and P3. If the static timing and noise analysis tool could reduce the stage delay of S0 by 0.4 ns and it results in removing timing violations from P3 and P4 as well as P1, then the static timing and noise analysis tool needs only one constraint for the stage delay reduction. However, if another net on P1 is chosen instead of S0, and the stage delay of the net is reduced, the static timing and noise analysis tool needs to generate more constraints to reduce stage delays for P3 and P4. Thus, in this example, reducing stage delay of S0 produces the minimum number of constraints.

In the above-described example, the static timing and noise analysis tool started with five negative slack paths that go through the bottleneck nets. However, it is common that a large number of paths pass through the nets. For example, in practice the inventors have observed more than 0.1 million paths that go through one net exist in some IC designs. As the proposed method of FIG. 2A is linear and proportional to the number of paths, finding minimum number of constraints for the paths takes a long time if the number of paths is huge. The following section describes how to address this kind of issue, by iteration.

Figure 11B:
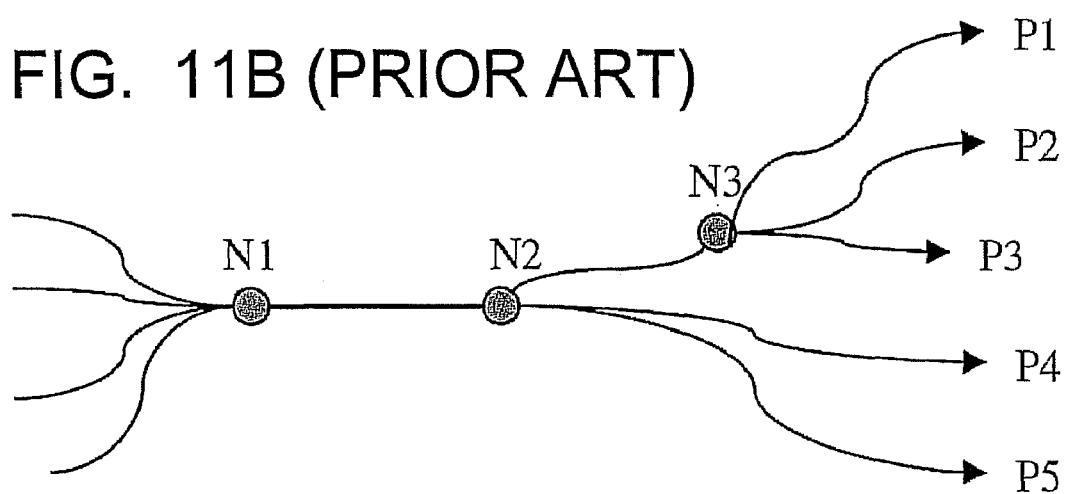

FIG. 11B shows five negative slack paths that share three nets. After analyzing paths P1, P2, P3, P4 and P5, the static timing and noise analysis tool identifies N1 and N2 as the nets with the most number of paths passing through the nets and reduces stage delays of them. However, the static timing and noise analysis tool does not need to analyze all the five paths to remove timing violations from the five paths. Analyzing only any two of them reduces the stage delays of the same net N1 and N2. If the place and route tool fixes nets N1 and N2, it would fix all the timing violations and make the five paths with positive slacks. This technique is beneficial especially when the number of paths to be analyzed is large, such as more than million paths. Note that analyzing a subset of the paths requires iterations because the static timing and noise analysis tool does not know, ahead of time, whether the paths that are not chosen for analysis would be fixed or not.

Figure 12:
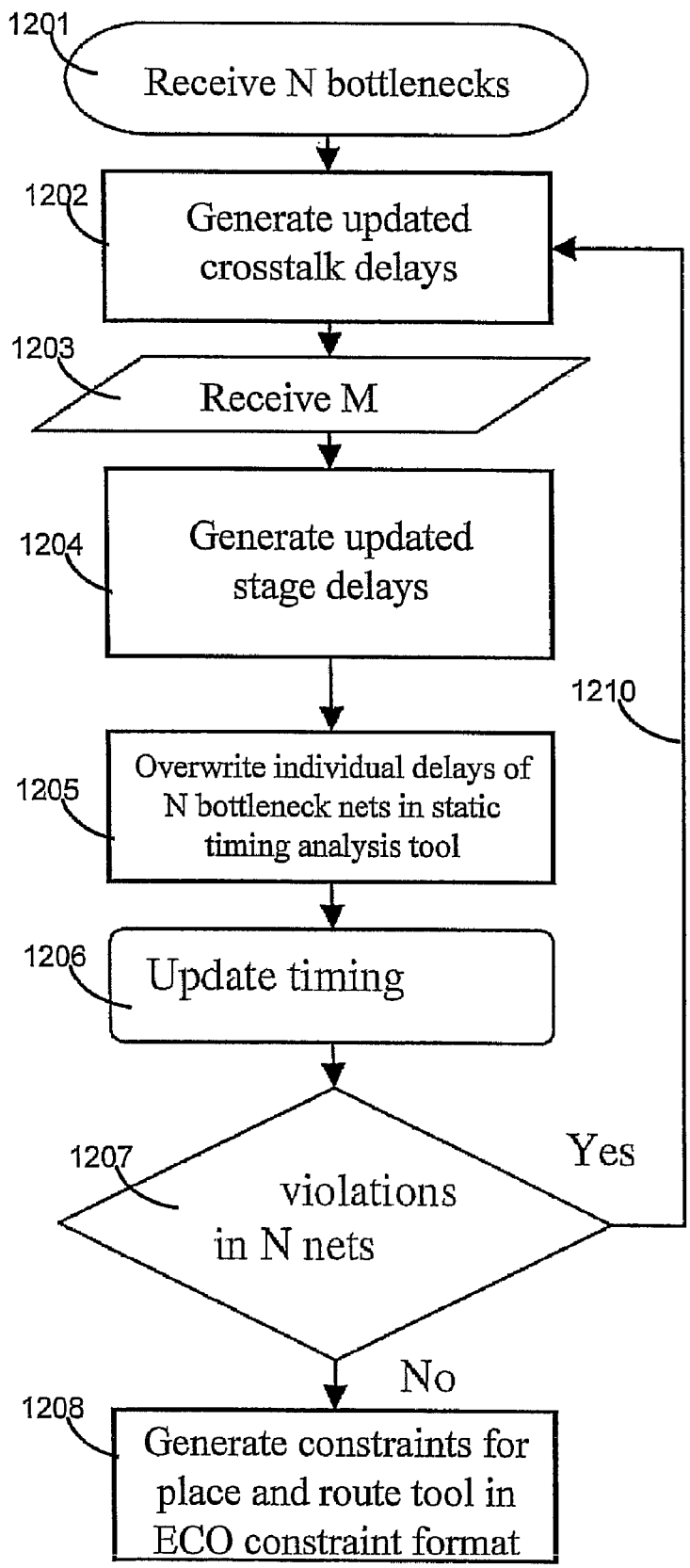
FIG. 12 illustrates in a low-level flow chart, a method performed by a computer in some embodiments of the invention.

FIG. 12 shows a flow chart of an iteration method that is performed by a programmed computer in some embodiments of the invention. Specifically, in act 1201 the computer receives N bottleneck nets and operates the static timing and noise analysis tool in act 1202 to generate reduced crosstalk delays of victim nets by upsizing. Then in act 1203, for each net, the computer retrieves a pre-determined number "P" to be used to identify the worst slack paths through the victim net that are to be corrected.

Next, the computer first checks whether the reduced crosstalk delay as computed by the static timing and noise analysis tool makes the slack of an entire path positive. If the slack is still negative after fixing crosstalk delays, the computer applies the iterative algorithm to reduce stage delays on the path and generates updated stage delays as per act 1204. Next, in act 1205, the ECO constraints are back-annotated to the static timing and noise analysis tool for example by overwriting pre-existing stage delays of the N bottleneck nets with the corresponding updated stage delays obtained, e.g. by upsizing a victim cell (driver). Next the timing of all paths in the entire IC design is updated in act 1206, and then the computer checks the N nets to see if they still have any paths with negative slacks. If there still exist negative slack paths, P of them (with worst slack) are again collected, and the iterative algorithm is applied again by returning via branch 1210 to act 1202 (described above). If no negative slack paths exist, then the computer goes to act 1208 to generate ECO constraints, expressed in the above-described ECO constraint format, for consumption by the place and route tool In the method shown in FIG. 12, P is the number of paths to be analyzed and determines the overall runtime of the computer when executing this method. If P is large, the static timing and noise analysis tool requires a long time to generate constraints but this reduces the number of iterations. On the other hand, if P is small, the static timing and noise analysis tool might quickly generate constraints but this increase the number of iterations, which may result in lengthening overall runtime because each iteration requires updating the timing database that sometimes takes a couple of hours for large designs.

For example, if P is selected to be 10, the static timing and noise analysis tool analyzes only maximum 10 paths for each bottleneck. Thus, it takes less than 70 seconds for each iteration, but it requires 3 iterations to remove all violations. On the other hand, if P is 100, the first iteration takes 90 seconds to analyze maximum 100 paths for each net, but all violations are removed after the second iterations resulting in shorter overall runtime than the previous. By choosing one million for P, the static timing and noise analysis tool could potentially remove all violations in the very first iteration, but it results in the longest overall runtime. Hence, a tradeoff is required to choose an appropriate value for P. Unfortunately the optimum value for P is dependent on the IC design. However, empirical results show that the static timing and noise analysis tool can get good results when P is between 100 and 1000.

The amount of improvement one can make for stage delay also determines the number of ECO constraints generated for the place and route tool. Suppose a path with −1 ns slack consists of 10 stages, and each stage has 2 ns of stage delay. If we can improve stage delay by 10%, we need 5 stages (0.2 ns×5=1 ns) to be improved to make the slack positive. However, if improving stage delay by 30%, only 2 stages need to be fixed because each stage can reduce 0.6 ns. Accordingly, the static timing and noise analysis tool is used to generate a minimum number of constraints for the place and route tool not only because runtime is improved but also because it reduces the probability of disrupting other parts of the design. The maximum limit on stage delay also depends on design characteristics and is to be determined by users. A higher limit produces less number of ECO constraints from the static timing and noise analysis tool but increase the number of ECO constraints that are rejected by the place and route tool because the constraints are too aggressive to be achieved. Lower limit satisfies the place and route tool to achieve the specified constraints but could create other violations due to a large number of changes requested for the design. Experiments on industrial designs have shown that stage delay limit is a sensitive setting. We found that for some IC designs, when we increase the mentioned limit P linearly, number of ECO constraints increase exponentially.

In some embodiments, the method of FIG. 12 is implemented by in a TCL script which can be invoked with various parameters as follows. Specifically, the Tcl version of this ECO constraint generation method accepts a list of size N of Signal Integrity bottleneck nets. User can specify the maximum number of paths P to be analyzed. It allows the user to specify the limitation on crosstalk delay change as a percentage of the original crosstalk delay (e.g. 50%). It further allows the user to specify a limitation on the stage delay change as a percentage of original stage delay (e.g. 10%). It also allows the user to set the number ECO constraint loop iteration, which imposes an upper limit on the number of times the branch 1210 in FIG. 12 is taken. It reads in a pin map that translates the pins in static timing and noise analysis tool to the pins in place and route tool. Finally, it generates an output file as the above described ECO constraint format.

The following appendices A, B and C are integral parts of this detailed description and are incorporated by reference herein in their entirety. These appendices provide further detailed descriptions of implementation of an illustrative embodiment of the type shown in FIGS. 2A and 2B.

In some embodiments, a computer-implemented method in accordance with the invention estimates at least one change in timing behavior of each candidate net required to be made to overcome a violation as follows: computing a change in cell delay in an enlarged version of a cell in a victim net in a set of candidate nets, computing a change in net delay in at least the victim net using a simplified representation of a path in the netlist, and computing a change in crosstalk delay in at least the victim net by using values of total resistance and total capacitance of the victim net and the aggressor net and the input capacitance of the receiver cells of the victim net and the aggressor net, and the resistance of the victim net driver cell and the resistance of the aggressor net driver cell. In certain embodiments, the computer-implemented method applies a closed form equation for the aggressor net with rail voltage of the aggressor cell and the values of total resistance and total capacitance of the aggressor net and the victim net, to obtain a maximum height of a bump arising in the victim net due to crosstalk from the aggressor net. In the certain embodiments, the applying is repeated with the values of the rail voltage of the aggressor and the values of total resistance and total capacitance of the aggressor net and the victim net and an enlarged version of said victim net driver cell, thereby to obtain a smaller maximum height of said bump for each aggressor net capacitively coupled to a repaired version of said victim net, wherein the repaired version of the victim net comprises the enlarged version of the victim net's driver cell.

APPENDIX A

```
1
2
3 ESTIMATE BEHAVIOR CHANGES (see act 216 in FIG. 2A)
4 Estimate_timing_change(net)
5 {
6   estimate crosstalk delay via Estimate_crosstalk_delay in Appendix C
7   estimate previous and current stage cell delay via
      Estimate_cell_delay( ) in
8   Appendix C
9   estimate previous and current stage net delay via
      Estimate_net_delay( ) in
10  Appendix C
11  compute Δd using equation (1)
12      return Δd
13 }
14
15 IDENTIFY SUBSET OF NETS TO REPAIR (see FIG. 2A),
16 This embodiment is based on Integer Linear Programming (ILP)
17 Estimate_ECO_changes( )
18 {
19      Collect timing paths with violations P (FIG. 8)
20      Identify nets with crosstalk delays on P (see act 215 in FIG. 2A)
21
22      For every net n in N {         (see act 216 in FIG. 2A)
23          For each aggressor of n {
24              Δd = Estimate_timing_change(aggressor net)
25              if (Δd < 0)
26                  go to next net
27          }
28          Δdj = Estimate_timing_change(victim net)
29      }
30
31      Construct matrix R with dj as in equation (11) (see act 217 in
        FIG. 2A)
32      Construct matrix C with P and N as in equation (10)
33      Construct vector x as in equation (12)
34      Construct matrix S as in equation (14)
35      k = 0
36      do {
37          k = k + 1
38          Choose $x_k$ using equation (18)
39          Compute $S_{k+1} = S_k - CRx_k$
40      } while ($|S_{k+1}| > 0$)
41
42      x = $x_1 + \ldots + x_k$
43 }
44
45 GENERATE CONSTRAINTS ON ECO (see act 218 in FIG. 2A)
46 Generate_constraints(x)
47 {
48      For each element of x {
49          if jth element is 1 {
50              For min_rise, min_fall, max_rise, and max_fall {
51                  repair_constraint = dj / original delta_delay
52                  write repair_constraint to the constraint file F
53              }
54          }
55      }
56 }
57
58 GENERATE ECO (see act 212A in FIG. 2A and also see FIG. 2B)
59 P&R_fix_ECO_using_constraints(F)
60 {
61      Read repair constraints from the constraint file F
62      while (no constraints left in F) {
63          Read constraint from F
64          For every fixing method the tool has {
65              Try to fix the stage with the method
66              if (satisfy the constraint) {
67                  move to the next constraint
68              }
69          }
70      }
71 }
72
```

APPENDIX B

```
73
74
75 IDENTIFY SUBSET OF NETS TO REPAIR (see FIG. 2A),
76 This is for an alternative embodiment based on simulation annealing
77 Estimate_ECO_changes( )
78 {
79      Collect timing paths with violations P (FIG. 8)
80      For each path p of P {
81          path_slack = path slack of p
82          For each net n of p {
```

APPENDIX B-continued

```
83              Δd = Estimate_timing_change(victim net)
84              path_slack = path_slack − Δd
85                  if (slack > 0) {
86                      move to the next net
87                  }
88          }
89      }
90 }
```

APPENDIX C

```
91
92
93 ESTIMATE CELL DELAY CHANGE (see FIG. 3A)
94 Estimate_cell_delay(old_cell, new_cell, input_slew, load_cap)
95 {
96      new_load_cap = load_cap − old_cell_output_pin_cap
97              + new_cell_output_pin_cap
98      new_cell_delay = Library_lookup(new_cell, input_slew, new_load_cap)
99      return new_cell_delay
100 }
101
102 ESTIMATE CROSSTALK DELAY CHANGE USING EQUATIONS
103 (2)(3)(4)(5) (see FIG. 3A)
104 Estimate_one_crosstalk_bump(victim_net, victim_cell,
105                  aggressor_net, aggressor_cell){
106      R2 = get_drive_resistance_of(victim_net, victim_cell)
107      Ctotal_victim = get_total_ground_cap(victim_net) +
108                  get_total_coupling_cap(victim_net)
109   R1 = get_drive_resistance(aggressor_net, aggressor_cell)
110   Vdd_a = get_voltage(aggressor_net)
111   Cx = get_total_coupling_cap_between(victim_net, aggressor_net)
112   C1 = get_total_ground_cap(aggressor_net) +
113              get_total_coupling_cap(aggressor_net) − Cx
114   C2 = Ctotal_victim − Cx
115      Vp = get_aggressor_peak(Vdd_a, C2, C1, Cx, R1, R2)(equation 2)
116 }
117
118 Estimate_crosstalk_bump(victim_net, victim_cell){
119      Get active aggressor list for victim_net.
120      Vp_tot = 0.0;
121      For each aggressor net/cell in aggressor list {
122          Vp = Estimate_one_crosstalk_bump(victim_net,victim_cell,
123                      aggressor_net, aggressor_cell)
124          Vp_tot += Vp
125      }
126 }
127
128 Estimate_crosstalk_delay(victim_net, original_cell, new_cell) {
129 Vro = Circuit_simulator_bump_height(victim_net)
130 Vpo = Estimate_crosstalk_bump(victim_net, original_cell)
131 Vpn = Estimate_crosstalk_bump(victim_net, new_cell)
132 Vrn = (Vro * (Vpn/Vpo) )          (see equation 3)
133 Tr = get_transition_time(victim_net)
134 Vdd_v = get_voltage(victim_net)
135 Crosstalk_delay = (Tr * (Vrn/Vdd_v) ) (see equation 4)
136 }
137
138 ESTIMATE NET DELAY CHANGE USING EQUATIONS (6)(8) (see FIG.
139 3A)
140 Estimate_net_delay(net, original_cell, new_cell) {
141 Dn_orig = Accurate_original_net_delay(net)
142 Cn = get_total_ground_cap(net)
143 Rd_orig = get_drive_resistance(net, original_cell)
144 Delmore_orig = Estimate_elmore_delay(Rd_orig, Rn, Cn) (equation 6)
145 Rd_new = get_drive_resistance(net, new_cell)
146 Delmore_new = Estimate_elmore_delay(Rd_orig, Rn, Cn) (equation 6)
147 Net_delay = get_net_delay(Delmore_new, Delmore_orig, Dn_orig)
148          (equation 8)
149 }
150
```

What is claimed is:

1. A computer-implemented method of designing layouts of integrated circuits, the method comprising:
   performing a place and route operation on a netlist of an integrated circuit, to produce a layout for the integrated circuit;
   extracting parasitics of the integrated circuit based on the netlist and the layout;
   performing static timing analysis on the netlist based on the layout and the parasitics, to estimate timing behavior of the netlist and to identify at least one violation by said timing behavior of a corresponding timing requirement at an endpoint of a path in the netlist;
   performing engineering change order (ECO) analysis on the netlist based on the layout, the parasitics, said timing behavior, and said violation by:
   (a) identifying a plurality of victim nets located in a fanin cone of said endpoint and identifying a group of aggressor nets, wherein each aggressor net is capacitively coupled to one of said victim nets;
   (b) forming a set of candidate nets including said group of aggressor nets and said plurality of victim nets;
   (c) estimating at least one change in timing behavior of each candidate net required to be made to overcome said violation; and
   (d) choosing a subset of candidate nets to be repaired from among said set of candidate nets, based on said change estimated in (c);
   generating an ECO constraint on timing behavior of said subset, wherein said ECO constraint is to be satisfied by a ECO repair technique to be used to correct said violation;
   automatically selecting said ECO repair technique from among a plurality of ECO repair techniques, based on said ECO constraint; and
   repairing said layout by applying said ECO repair technique to generate a modified layout corrected for said violation.

2. The computer-implemented method of claim 1 wherein said estimating comprises:
   computing a change in cell delay in an enlarged version of a cell in a victim net in said set;
   computing a change in net delay in at least said victim net using a simplified representation of said path; and
   computing a change in crosstalk delay in at least said victim net by using values of total resistance and total capacitance of the said victim net and said aggressor net, and the input capacitance of the receiver cells of the said victim net and said aggressor net, and the resistance of said victim net driver cell and the resistance of said aggressor net driver cell.

3. The computer-implemented method of claim 2 wherein said computing of change in crosstalk delay comprises:
   applying a closed form equation for said aggressor net to obtain a maximum height of a bump arising in said victim net due to crosstalk from said aggressor net;
   repeating said applying, to obtain at least one additional maximum height of said bump in said victim net, due to crosstalk from at least one additional aggressor net capacitively coupled to said victim net;
   summing up maximum heights of said bump in said victim net obtained by said applyings, to obtain a first total of maximum heights of said bump in said victim net;
   repeating said applying to obtain a smaller maximum height of said bump for each aggressor net capacitively coupled to a repaired version of said victim net, wherein the repaired version of said victim net comprises the enlarged version of said victim net driver cell;
   repeating said summing up to obtain a second total of smaller maximum heights of said bump in said repaired victim net; and
   scaling an original height of the bump in said victim net obtained from said static timing analysis, with a ratio of said second total to said first total, to obtain an estimate of a final height of said bump in the repaired version of said victim net.

4. The computer-implemented method of claim 3 further comprising: scaling said final height of the repaired victim net, with a rail-to-rail transition time for said victim net obtained from said static timing analysis and a rail voltage of said victim net obtained from said static timing analysis, to obtain an estimate of crosstalk delay in the repaired victim net.

5. The computer-implemented method of claim 2 wherein said computing of change in net delay comprises:
   representing said victim net as a circuit comprising a resistance $R_d$ of said victim net driver cell in series with total resistance $R_n$ of said victim net, and further in series with total capacitance $C_n$ of said victim net, to obtain said simplified representation; and
   applying an Elmore Model to said simplified representation to compute $$d_{Elmore} = (R_d + R_n) \cdot C_n$$

where $d_{Elmore}$ is an indication of delay of said victim net;
   repeating said applying with a different resistance $R'_d$ for an enlarged version of said victim net driver cell to compute $$d'_{Elmore} = (R'_d + R_n) \cdot C_n$$

where $d'_{Elmore}$ is an indication of delay of the enlarged version of said victim net; and
   scaling an original net delay in the victim net obtained from said static timing analysis, with the ratio ($d'_{Elmore}/d_{Elmore}$), to obtain an estimate of net delay in the repaired version of said victim net.

6. The computer-implemented method of claim 2 wherein said computing of change in cell delay comprises:
   looking up a cell delay d1 of said victim net driver cell from a library;
   looking up another cell delay d2 of an enlarged version of said victim net driver cell, from said library; and
   scaling an original cell delay in the victim net obtained from said static timing analysis, with the ratio (d2/d1), to obtain an estimate of cell delay in the repaired version of said victim net.

7. The computer-implemented method of claim 1 wherein said choosing comprises:
   formulating an NP complete problem comprising identification of contribution of each net in said set to repair of said path and to repair of a plurality of additional paths, each additional path comprising at least one net in said set; and
   applying a predetermined heuristic iteratively to solve said NP complete problem.

8. The computer-implemented method of claim 7 wherein:
   said predetermined heuristic identifies a to-be-repaired net at each iteration by maximizing a total reduction in delay for all paths passing through said to-be-repaired net.

9. The computer-implemented method of claim 7 wherein:
   said NP complete problem is expressed as an Integer Linear Programming (ILP) problem.

10. A computer-implemented method of designing layouts of integrated circuits, the method comprising:

performing a place and route operation on a netlist of an integrated circuit, to produce a layout for the integrated circuit;

extracting parasitics of the integrated circuit based on the netlist and the layout;

performing static noise analysis on the netlist based on the layout and the parasitics, to estimate noise behavior of the netlist and to identify at least one violation by said noise behavior of a corresponding noise requirement on a victim net in the netlist;

performing engineering change order (ECO) analysis on the netlist based on the layout, the parasitics, said noise behavior, and said violation by:

(a) identifying a group of aggressor nets capacitively coupled to said victim net;

(b) forming a set of candidate nets including said group of aggressor nets and said victim net;

(c) estimating at least one change in noise behavior of each candidate net required to be made to overcome said violation; and (d) choosing a subset of candidate nets to be repaired from among said set of candidate nets, based on said change estimated in (c);

generating an ECO constraint on noise behavior of said subset, wherein said ECO constraint is to be satisfied by a ECO repair technique to be used to correct said violation;

automatically selecting said ECO repair technique from among a plurality of ECO repair techniques, based on said ECO constraint; and repairing said layout by applying said ECO repair technique to generate a modified layout corrected for said violation.

11. The computer-implemented method of claim 10 wherein said estimating comprises:

applying a closed form equation for said aggressor net to obtain a maximum height of a bump arising in said victim net due to crosstalk from said aggressor net;

repeating said applying, to obtain at least one additional maximum height of said bump in said victim net, due to crosstalk from at least one additional aggressor net capacitively coupled to said victim net;

summing up maximum heights of said bump in said victim net obtained by said applyings, to obtain a first total of maximum heights of said bump in said victim net;

repeating said applying to obtain a smaller maximum height of said bump for each aggressor net capacitively coupled to a repaired version of said victim net, wherein the repaired version of said victim net comprises the enlarged version of said victim net driver cell;

repeating said summing up to obtain a second total of smaller maximum heights of said bump in said repaired victim net; and scaling an original height of the bump in said victim net obtained from said static timing analysis, with a ratio of said second total to said first total, to obtain an estimate of a final height of said bump in the repaired version of said victim net.

12. The computer-implemented method of claim 10 wherein said choosing comprises:

formulating an NP complete problem comprising identification of contribution of each net in said set to repair of said path and to repair of a plurality of additional paths, each additional path comprising at least one net in said set; and applying a predetermined heuristic iteratively to solve said NP complete problem.

13. The computer-implemented method of claim 12 wherein:

said predetermined heuristic identifies a to-be-repaired net at each iteration by maximizing a total reduction in noise for all paths passing through said to-be-repaired net.

14. A computer-implemented method of designing layouts of integrated circuits, the method comprising:

receiving a netlist of an integrated circuit to be fabricated;

performing a place and route operation on the netlist, to produce a layout for the integrated circuit;

extracting parasitics of the integrated circuit based on the netlist and the layout;

performing analysis of at least one of (timing and noise) on the netlist based on the layout and the parasitics, to estimate behavior of the netlist and to identify at least one violation by said behavior of a corresponding requirement;

performing engineering change order (ECO) analysis on the netlist based on the layout, the parasitics, said behavior, and said violation;

generating an ECO constraint on said behavior based on a result of said performing ECO analysis;

testing on said layout each ECO repair technique in a plurality of ECO repair techniques successively, until an ECO repair technique is found to satisfy said ECO constraint; and repairing said layout by applying said ECO repair technique found to be satisfactory by said testing, to generate a modified layout corrected for said violation.

15. The computer-implemented method of claim 14 wherein said performing ECO analysis comprises:

(a) identifying a plurality of victim nets contributing to said behavior; and (b) forming a set of candidate nets including said plurality of victim nets and a plurality of aggressor nets, wherein each aggressor net is capacitively coupled to a victim net.

16. The computer-implemented method of claim 14 wherein said performing ECO analysis comprises:

(a) estimating at least one change in behavior of each candidate net required to be made to overcome said violation; and (b) choosing a subset of candidate nets to be repaired from among said set of candidate nets, based on said change estimated in (b).

17. A non-transitory computer-readable medium storing a plurality of instructions to implement designing of layouts of integrated circuits, the plurality of instructions comprising:

instructions to perform a place and route operation on a netlist of an integrated circuit, to produce a layout for the integrated circuit;

instructions to extract parasitics of the integrated circuit based on at least one of the netlist and the layout;

instructions to perform static timing analysis on the netlist based on the layout and the parasitics, to estimate timing behavior of the netlist and to identify at least one violation by said timing behavior of a corresponding timing requirement at an endpoint of a path in the netlist;

instructions to perform engineering change order (ECO) analysis on the netlist based on the layout, the parasitics, said timing behavior, and said violation by execution of:

(a) instructions to identify a plurality of victim nets located in a fanin cone of said endpoint and identify a group of aggressor nets, wherein each aggressor net is capacitively coupled to one of said victim nets;

(b) instructions to form a set of candidate nets including said group of aggressor nets and said plurality of victim nets;
(c) instructions to estimate at least one change in timing behavior of each candidate net required to be made to overcome said violation; and
(d) instructions to choose a subset of candidate nets to be repaired from among said set of candidate nets, based on said change estimated by execution of said (c) instructions to estimate;

instructions to generate an ECO constraint on timing behavior of said subset, wherein said ECO constraint is to be satisfied by a ECO repair technique to be used to correct said violation;

instructions to automatically select said ECO repair technique from among a plurality of ECO repair techniques, based on said ECO constraint; and instructions to repair said layout by applying said ECO repair technique to generate a modified layout corrected for said violation.

18. The non-transitory computer-readable medium of claim 17 wherein said instructions to estimate comprise:
instructions to compute a change in cell delay in an enlarged version of a cell in a victim net in said set;
instructions to compute a change in net delay in at least said victim net; and
instructions to compute a change in crosstalk delay in at least said victim net by using values of total resistance and total capacitance of the said victim net and said aggressor net, and the input capacitance of the receiver cells of the said victim net and said aggressor net, and the resistance of said victim net driver cell and the resistance of said aggressor net driver cell.

19. The non-transitory computer-readable medium of claim 17 wherein said instructions to choose comprise:
instructions to formulate an NP complete problem comprising identification of contribution of each net in said set to repair of said path and to repair of a plurality of additional paths, each additional path comprising at least one net in said set.

20. A non-transitory computer-readable medium storing a plurality of instructions to implement designing of layouts of integrated circuits, the plurality of instructions comprising:
instructions to perform a place and route operation on a netlist of an integrated circuit, to produce a layout for the integrated circuit;
instructions to extract parasitics of the integrated circuit based on the netlist and the layout;
instructions to perform static noise analysis on the netlist based on the layout and the parasitics, to estimate noise behavior of the netlist and to identify at least one violation by said noise behavior of a corresponding noise requirement on a victim net in the netlist;
instructions to perform engineering change order (ECO) analysis on the netlist based on the layout, the parasitics, said noise behavior, and said violation by execution of:
(a) instructions to identify a group of aggressor nets capacitively coupled to said victim net;
(b) instructions to form a set of candidate nets including said group of aggressor nets and said victim net;
(c) instructions to estimate at least one change in noise behavior of each candidate net required to be made to overcome said violation; and
(d) instructions to choose a subset of candidate nets to be repaired from among said set of candidate nets, based on said change estimated by execution of said (c) instructions to estimate;

instructions to generate an ECO constraint on noise behavior of said subset, wherein said ECO constraint is to be satisfied by a ECO repair technique to be used to correct said violation;

instructions to automatically select said ECO repair technique from among a plurality of ECO repair techniques, based on said ECO constraint; and instructions to repair said layout by applying said ECO repair technique to generate a modified layout corrected for said violation.

21. The non-transitory computer-readable medium of claim 20 wherein said instructions to estimate comprise:
instructions to apply a closed form equation for said aggressor net, to obtain a maximum height of a bump arising in said victim net due to crosstalk from said aggressor net;
instructions to repeatedly execute said instructions to apply, to obtain at least one additional maximum height of said bump in said victim net, due to crosstalk from at least one additional aggressor net capacitively coupled to said victim net;
instructions to sum up maximum heights of said bump in said victim net obtained by execution of said instructions to apply, to obtain a first total of maximum heights of said bump in said victim net;
instructions to repeatedly execute said instructions to apply, to obtain a smaller maximum height of said bump for each aggressor net capacitively coupled to a repaired version of said victim net, wherein the repaired version of said victim net comprises the enlarged version of said victim net driver cell;
instructions to repeatedly execute said instructions to sum up to obtain a second total of smaller maximum heights of said bump in said repaired victim net; and
instructions to scale an original height of the bump in said victim net obtained from execution of said instructions to perform said static timing analysis, with a ratio of said second total to said first total, to obtain an estimate of a final height of said bump in the repaired version of said victim net.

22. The non-transitory computer-readable medium of claim 20 wherein said instructions to choose comprise:
instructions to formulate an NP complete problem comprising identification of contribution of each net in said set to repair of said path and to repair of a plurality of additional paths, each additional path comprising at least one net in said set; and
instructions to apply a predetermined heuristic iteratively to solve said NP complete problem.

23. The non-transitory computer-readable medium of claim 22 wherein:
said predetermined heuristic identifies a to-be-repaired net at each iteration by maximizing a total reduction in noise for all paths passing through said to-be-repaired net.

24. A non-transitory computer-readable medium storing a plurality of instructions to implement designing of layouts of integrated circuits, the plurality of instructions comprising:
instructions to receive a netlist of an integrated circuit to be fabricated;
performing a place and route operation on the netlist, to produce a layout for the integrated circuit;
instructions to extract parasitics of the integrated circuit based on the netlist and the layout;
instructions to perform analysis of at least one of (timing and noise) on the netlist based on the layout and the parasitics, to estimate behavior of the netlist and to identify at least one violation by said behavior of a corresponding requirement;

instructions to perform engineering change order (ECO) analysis on the netlist based on the layout, the parasitics, said behavior, and said violation;

instructions to generate an ECO constraint on said behavior based on a result of said performing ECO analysis;

instructions to test on said layout each ECO repair technique in a plurality of ECO repair techniques successively, until an ECO repair technique is found to satisfy said ECO constraint; and instructions to repair said layout by applying said ECO repair technique found to be satisfactory by said testing, to generate a modified layout corrected for said violation.

25. The non-transitory computer-readable medium of claim 24 wherein said instructions to perform ECO analysis comprise:
(a) instructions to identify a plurality of victim nets contributing to said behavior; and
(b) instructions to form a set of candidate nets including said plurality of victim nets and a plurality of aggressor nets, wherein each aggressor net is capacitively coupled to a victim net.

26. The non-transitory computer-readable medium of claim 24 wherein said instructions to perform ECO analysis comprise:
(a) instructions to estimate at least one change in behavior of each candidate net required to be made to overcome said violation; and
(b) instructions to choose a subset of candidate nets to be repaired from among said set of candidate nets, based on said change estimated by execution of said (b) instructions to estimate at least one change.

27. A non-transitory computer-readable medium storing a plurality of instructions to implement designing of layouts of integrated circuits, the plurality of instructions comprising:
instructions to perform a place and route operation on a netlist of an integrated circuit, to produce a layout for the integrated circuit;
instructions to extract parasitics of the integrated circuit based on the netlist and the layout;
instructions to perform static timing analysis on the netlist based on the layout and the parasitics, to estimate timing behavior of the netlist and to identify at least one violation by said timing behavior of a corresponding timing requirement at an endpoint of a path in the netlist;
instructions to perform engineering change order (ECO) analysis on the netlist based on the layout, the parasitics, said timing behavior, and said violation by execution of:
(a) instructions to identify a plurality of victim nets located in a fanin cone of said endpoint and identifying a group of aggressor nets, wherein each aggressor net is capacitively coupled to one of said victim nets;
(b) instructions to form a set of candidate nets including said group of aggressor nets and said plurality of victim nets;
(c) instructions to estimate at least one change in timing behavior of each candidate net required to be made to overcome said violation; and
(d) instructions to choose a subset of candidate nets to be repaired from among said set of candidate nets, based on said change estimated in (c);

instructions to generate an ECO constraint on timing behavior of said subset, wherein said ECO constraint is to be satisfied by a ECO repair technique to be used to correct said violation;

instructions to automatically select said ECO repair technique from among a plurality of ECO repair techniques, based on said ECO constraint; and instructions to repair said layout by applying said ECO repair technique to generate a modified layout corrected for said violation;

wherein said (c) instructions to estimate comprise instructions to compute a change in crosstalk delay in at least said victim net by using values of total resistance and total capacitance of said victim net and an aggressor net, and input capacitance of receiver cells of said victim net and said aggressor net, and resistance of said victim net's driver cell and resistance of said aggressor net's driver cell.

28. The non-transitory computer-readable medium of claim 27 wherein said instructions to estimate comprise:
instructions to compute a change in cell delay in an enlarged version of said victim net's driver cell; and
instructions to compute a change in net delay in at least said victim net using a simplified representation of said path.

29. The non-transitory computer-readable medium of claim 27 wherein said instructions to compute a change in crosstalk delay comprise:
instructions to apply a closed form equation for said aggressor net to obtain a maximum height of a bump arising in said victim net due to crosstalk from said aggressor net;
instructions to repeatedly execute said instructions to apply to obtain at least one additional maximum height of said bump in said victim net, due to crosstalk from at least one additional aggressor net capacitively coupled to said victim net;
instructions to sum up maximum heights of said bump in said victim net obtained by said executing said instructions to apply, to obtain a first total of maximum heights of said bump in said victim net;
instructions to repeatedly execute said instructions to apply with an enlarged version of said victim net's driver cell, thereby to obtain a smaller maximum height of said bump for each aggressor net capacitively coupled to a repaired version of said victim net, wherein the repaired version of said victim net comprises the enlarged version of said victim net's driver cell;
instructions to repeatedly execute said instructions to sum up to obtain a second total of smaller maximum heights of said bump in said repaired victim net; and
instructions to scale an original height of the bump in said victim net obtained from execution of said instructions to perform said static timing analysis, with a ratio of said second total to said first total, to obtain an estimate of a final height of said bump in the repaired version of said victim net.

30. A non-transitory computer-readable medium storing a plurality of instructions to implement designing of layouts of integrated circuits, the plurality of instructions comprising:
instructions to perform a place and route operation on a netlist of an integrated circuit, to produce a layout for the integrated circuit;
instructions to extract parasitics of the integrated circuit based on the netlist and the layout;
instructions to perform static noise analysis on the netlist based on the layout and the parasitics, to estimate noise behavior of the netlist and to identify at least one violation by said noise behavior of a corresponding noise requirement on a victim net in the netlist;

instructions to perform engineering change order (ECO) analysis on the netlist based on the layout, the parasitics, said noise behavior, and said violation by execution of:
(a) instructions to identify a group of aggressor nets capacitively coupled to said victim net;
(b) instructions to form a set of candidate nets including said group of aggressor nets and said victim net;
(c) instructions to estimate at least one change in noise behavior of each candidate net required to be made to overcome said violation; and
(d) instructions to choose a subset of candidate nets to be repaired from among said set of candidate nets, based on said change estimated by execution of said (c) instructions to estimate;

instructions to generate an ECO constraint on noise behavior of said subset, wherein said ECO constraint is to be satisfied by a ECO repair technique to be used to correct said violation;

instructions to automatically select said ECO repair technique from among a plurality of ECO repair techniques, based on said ECO constraint; and instructions to repair said layout by applying said ECO repair technique to generate a modified layout corrected for said violation wherein said (c) instructions to estimate comprise instructions to compute a change in crosstalk delay in at least said victim net by using values of total resistance and total capacitance of said victim net and an aggressor net, and input capacitance of receiver cells of said victim net and said aggressor net, and resistance of said victim net's driver cell and resistance of said aggressor net's driver cell.

31. The non-transitory computer-readable medium of claim 30 wherein said instructions to estimate comprise:
instructions to apply a closed form equation for said aggressor net to obtain a maximum height of a bump arising in said victim net due to crosstalk from said aggressor net;
instructions to repeatedly execute said instructions to apply, to obtain at least one additional maximum height of said bump in said victim net, due to crosstalk from at least one additional aggressor net capacitively coupled to said victim net;
instructions to sum up maximum heights of said bump in said victim net obtained by said applyings, to obtain a first total of maximum heights of said bump in said victim net;
instructions to repeatedly execute said instructions to apply with an enlarged version of said victim net driver cell, thereby to obtain a smaller maximum height of said bump for each aggressor net capacitively coupled to a repaired version of said victim net, wherein the repaired version of said victim net comprises the enlarged version of said victim net driver cell;
instructions to repeatedly execute said instructions to sum up to obtain a second total of smaller maximum heights of said bump in said repaired victim net; and
instructions to scale an original height of the bump in said victim net obtained from said static timing analysis, with a ratio of said second total to said first total, to obtain an estimate of a final height of said bump in the repaired version of said victim net.

32. The non-transitory computer-readable medium of claim 30 wherein said instructions to choose comprise:
instructions to formulate an NP complete problem comprising identification of contribution of each net in said set to repair of said path and to repair of a plurality of additional paths, each additional path comprising at least one net in said set.

33. A non-transitory computer-readable medium storing a plurality of instructions to implement designing of layouts of integrated circuits, the plurality of instructions comprising:
instructions to receive a netlist of an integrated circuit to be fabricated;
instructions to perform a place and route operation on the netlist, to produce a layout for the integrated circuit;
instructions to extract parasitics of the integrated circuit based on the netlist and the layout;
instructions to perform analysis of at least one of (timing and noise) on the netlist based on the layout and the parasitics, to estimate behavior of the netlist and to identify at least one violation by said behavior of a corresponding requirement;
instructions to perform engineering change order (ECO) analysis on the netlist based on the layout, the parasitics, said behavior, and said violation;
gene instructions to generate an ECO constraint on said behavior based on a result of said performing ECO analysis;
instructions to test on said layout each ECO repair technique in a plurality of ECO repair techniques successively, until an ECO repair technique is found to satisfy said ECO constraint; and
instructions to repair said layout by applying said ECO repair technique found to be satisfactory by execution of said instruction to test, to generate a modified layout corrected for said violation;
wherein said instruction to perform ECO analysis comprise instructions to estimate at least one change in behavior of a first net in the netlist to overcome said violation; and
wherein said instructions to estimate comprise instructions to compute a change in crosstalk delay in said first net by using values of total resistance and total capacitance of said first net and a second net in said netlist, and the input capacitance of receiver cells of said first net and said second net, and resistance of said first net's driver cell and resistance of said second net's driver cell.

34. The non-transitory computer-readable medium of claim 33 wherein said instructions to perform ECO analysis comprise:
instructions to identify a plurality of victim nets contributing to said behavior, said plurality of victim nets comprising said first net;
instructions to form a set of candidate nets including said plurality of victim nets and a plurality of aggressor nets, wherein each aggressor net is capacitively coupled to a victim net said plurality of aggressor nets comprising said second net; and
instructions to choose a subset of candidate nets to be repaired from among said set of candidate nets, based on said change estimated in execution of said instructions to perform ECO analysis.

* * * * *